US012593618B2

(12) United States Patent
Poccia et al.

(10) Patent No.: US 12,593,618 B2
(45) Date of Patent: Mar. 31, 2026

(54) HIGH-TEMPERATURE SUPERCONDUCTING QUBIT COMPRISING QUANTUM-MECHANICAL TWO-LEVEL SYSTEM AND FABRICATION

(71) Applicant: Terra Quantum AG, St. Gallen (CH)

(72) Inventors: Nicola Poccia, St. Gallen (CH);
Francesco Tafuri, St. Gallen (CH);
Valerii Vinokour, St. Gallen (CH)

(73) Assignee: Terra Quantum AG, St. Gallen (CH)

( * ) Notice: Subject to any disclaimer, the term of this patent is extended or adjusted under 35 U.S.C. 154(b) by 781 days.

(21) Appl. No.: 17/868,477

(22) Filed: Jul. 19, 2022

(65) Prior Publication Data

US 2023/0023319 A1     Jan. 26, 2023

(30) Foreign Application Priority Data

Jul. 21, 2021    (EP) .................................... 21187004

(51) Int. Cl.
*H10N 60/12*      (2023.01)
*G06N 10/40*      (2022.01)
*H10N 69/00*      (2023.01)

(52) U.S. Cl.
CPC ............. *H10N 60/12* (2023.02); *G06N 10/40* (2022.01); *H10N 69/00* (2023.02)

(58) Field of Classification Search
CPC .. G06N 10/40; H10N 69/00; H10N 60/00–99; H10N 60/0156;
(Continued)

(56) References Cited

U.S. PATENT DOCUMENTS

2002/0119893 A1*  8/2002  Hughes ................... C30B 29/22
                                                     505/300
2002/0179937 A1*  12/2002  Ivanov ................... B82Y 10/00
                                                     257/E39.015
(Continued)

FOREIGN PATENT DOCUMENTS

CN          106575667 A      4/2017
CN          110494998 A      11/2019
(Continued)

OTHER PUBLICATIONS

European Patent Office, Extended European Search Report in European Patent Application No. 21187004.3 (Jan. 26, 2022).
(Continued)

*Primary Examiner* — Didarul A Mazumder
(74) *Attorney, Agent, or Firm* — Fitch Even Tabin & Flannery LLP

(57)         ABSTRACT

A high-temperature superconducting qubit implements a quantum mechanical two-level system. The high-temperature superconducting qubit comprises a first superconductor, a second superconductor, and an overlap region. The first superconductor comprises a first high-temperature superconductor material. The second superconductor comprises a second high-temperature superconductor material. In the overlap region, at least a first section of the first surface and at least a second section of the second surface overlap, the first section and the second section are arranged in parallel at a distance corresponding to a predefined distance, and the first orientation and the second orientation are arranged with an angle corresponding to a predefined angle. The high-temperature superconducting qubit comprises a Josephson junction between the first high-temperature superconductor material and the second high-temperature superconductor material. The Josephson junction provides the quantum
(Continued)

mechanical two-level system of the high-temperature super-conducting qubit.

12 Claims, 13 Drawing Sheets

(58) Field of Classification Search
CPC ...... H10N 60/857–858; H10N 60/0268–0828; H10N 60/12–126; H10N 60/0912–0941; H10N 60/805; H10N 60/124; H10N 60/0941; B82Y 10/00
USPC ............................................................ 257/31
See application file for complete search history.

(56) References Cited

U.S. PATENT DOCUMENTS

| 2003/0027724 | A1 | | 2/2003 | Rose et al. | |
|---|---|---|---|---|---|
| 2003/0038285 | A1 | * | 2/2003 | Amin | H10N 60/0941 |
| | | | | | 257/E39.015 |

| 2003/0102470 | A1 | * | 6/2003 | Il'ichev | H10N 60/0941 |
|---|---|---|---|---|---|
| | | | | | 257/31 |
| 2011/0089405 | A1 | * | 4/2011 | Ladizinsky | H10N 60/805 |
| | | | | | 257/31 |
| 2016/0093420 | A1 | * | 3/2016 | Urzhumov | H10N 60/80 |
| | | | | | 29/599 |

FOREIGN PATENT DOCUMENTS

| CN | 111244259 A | 6/2020 |
|---|---|---|
| CN | 113036030 A | 6/2021 |
| WO | WO 2002/069411 A2 | 9/2002 |
| WO | WO 2003/019685 A2 | 3/2003 |
| WO | WO 2008/089559 A1 | 7/2008 |

OTHER PUBLICATIONS

National Intellectual Property Administration of the People's Republic of China, Office Action in Chinese Patent Application No. 202210857820.7, 22 pp. (Aug. 26, 2025).

* cited by examiner

HIGH-TEMPERATURE SUPERCONDUCTING QUBIT COMPRISING QUANTUM-MECHANICAL TWO-LEVEL SYSTEM AND FABRICATION

TECHNICAL FIELD

The disclosure relates to a superconducting qubit employing high-temperature superconductors for applications in quantum information processing.

BACKGROUND

A quantum computer may solve certain classes of problem more quickly than a classical computer. This is achieved with the use of qubits, which provide a quantum-mechanical superposition of two states ("0" and "1") instead of classical bits which may only be in either of the two states. Challenges in the implementation of a quantum computer concern the implementation and manipulation of the qubits. A promising approach uses qubits based on superconductors and Josephson junctions. Low-temperature superconductors, for example, elemental superconductors such as aluminum, have been applied in Josephson junctions and qubits with coherence times approaching a millisecond. In a pressing quest of emerging quantum technologies, technology based on Josephson junctions and qubits based on aluminum has successfully demonstrated quantum supremacy and produced a first generation of commercial quantum computers. However, despite their high quality, the Al Josephson junctions and, in general, all qubit devices based on low-temperature superconductors have some intrinsic limits due to the relatively low quality factor of the Al Josephson junction (the quality factor of a junction is the product between its critical current and the value of the normal state resistance) and the small superconducting gap of aluminum, which affect the dynamics of the Al Josephson junction and the qubit device. In addition, the Al Josephson junction is strongly affected by magnetic fields because of the intrinsic superconducting properties of Al, such as the small superconducting gap, and its critical temperature is very low, about 1 K. Consequently, the corresponding properties of a qubit comprising a low-temperature superconductor Josephson junction, such as an Al Josephson junction, are limited, resulting, for example, in a low operation temperature and limited read and write frequencies. In particular, the low operation temperature causes significant technological efforts and costs in an operation of a quantum computer comprising the qubit based on low-temperature superconductor. The significant technological efforts and costs may for example be related to using a dilution refrigerator to cool the whole quantum processor and its components, including the qubits and Josephson junctions. The same problems of a qubit based on low-temperature superconductor also apply when the qubit is used in other quantum devices, such as a quantum sensor.

Overview

In view of the technical problems described above, there is a need for an improved superconducting qubit, which provides an enhanced critical temperature, an improved critical current, an improved critical magnetic field, an improved quality factor, improved noise characteristics, a reduced sensitivity to a magnetic field, and/or an improved read and/or write frequency.

This objective is achieved with a high-temperature superconducting qubit according to independent claim 1.

In a first aspect, a high-temperature superconducting qubit comprises a first superconductor, a second superconductor, and an overlap region. The first superconductor comprises a first high-temperature superconductor material comprising a first surface, and a first orientation. The second superconductor comprises a second high-temperature superconductor material comprising a second surface, and a second orientation. In the overlap region, at least a first section of the first surface and at least a second section of the second surface overlap, the first section and the second section are arranged in parallel at a distance corresponding to a predefined distance, and the first orientation and the second orientation are arranged with an angle corresponding to a predefined angle. The high-temperature superconducting qubit is characterized in that it comprises a Josephson junction between the first high-temperature superconductor material and the second high-temperature superconductor material. The Josephson junction is adapted to provide a quantum mechanical two-level system of the high-temperature superconducting qubit.

In the context of the present disclosure, a qubit may denote a quantum-mechanical two-level system suitable for quantum information processing.

A quantum-mechanical two-level system may be a system having at least two distinguishable quantum states, and may have any higher number of distinguishable quantum states, in particular any integer number of distinguishable quantum states.

The high-temperature superconducting qubit may be adapted to implement the quantum mechanical two-level system.

The Josephson junction may be adapted to provide a plurality of quantum mechanical states. In particular, the Josephson junction may be adapted to provide a first quantum mechanical state of the quantum mechanical two-level system and a second quantum mechanical state of the quantum mechanical two-level system. The first quantum mechanical state and the second quantum mechanical state may be states of the plurality of quantum mechanical states with lowest energies. In particular, the first quantum mechanical state of the quantum mechanical two-level system may be a ground state of the plurality of quantum mechanical states. In particular, the second quantum mechanical state of the quantum mechanical two-level system may be a lowest-energy excitation state of the plurality of quantum mechanical states. The first quantum mechanical state may be different from the second quantum mechanical state, in particular with respect to energy, spin, spatial distribution, charge on the Josephson junction, direction of a current through the Josephson junction, and/or phase of a current through the Josephson junction. In particular, an energy difference between the second state and the first state may be different from an energy difference of any pair of states of the plurality of quantum mechanical states.

The practically viable implementation of a high-temperature superconducting qubit, and in general of a Josephson junction between high-temperature superconductor materials providing a quantum mechanical two-level system suitable for a qubit, remained a challenge in the state-of-the-art. The Josephson junction according to the present disclosure solves this problem, provides the quantum mechanical two-level system and permits to implement the high-temperature superconducting qubit.

Embodiments of the disclosure provide improvements to the first and/or second high-temperature superconductor material, in particular at the first and/or second surface, and to the Josephson junction. The first and/or second high-temperature superconductor material according to the disclosure may have improved superconducting material properties, such as a superconducting gap, a critical temperature, a critical current, and/or a critical magnetic field. This may improve corresponding superconducting junction properties of the Josephson junction. Alternatively or in addition, superconducting junction properties such as a quality factor of the Josephson junction, wherein the quality factor may be a product of a critical current of the Josephson junction and a normal state resistance of the Josephson junction, may be improved. Consequently, superconducting qubit properties of the high-temperature superconducting qubit corresponding to the superconducting material properties and/or the superconducting junction properties may be improved. Alternatively, or in addition, superconducting qubit properties such as a sensitivity to external fields, a sensitivity to a magnetic field, and/or a read and/or write frequency may be improved.

The high-temperature superconducting qubit may further comprise an inductance loop coupled to the Josephson junction.

The Josephson junction may be adapted to provide the work of the high temperature superconducting qubit at low magnetic fields, in particular at zero magnetic field. Alternatively or in addition, the Josephson junction may be adapted to provide the work of the high temperature superconducting qubit at low frequencies. The work of the high temperature superconducting qubit at the low magnetic fields, in particular at the zero magnetic field and/or the work of the high temperature superconducting qubit at the low frequencies may be adapted to lower a qubit sensitivity to an ambient noise.

For example, the low frequencies may be associated with a frequency of a microwave signal adapted for readout and/or control of the quantum mechanical two-level system. For example, the work of the high temperature superconducting qubit may be associated with or comprise an operability of the high temperature superconducting qubit. The magnetic field may be associated with a magnetic field in the vicinity of or at the high temperature superconducting qubit, in particular in the vicinity of or at the Josephson junction, or in the vicinity of or at the inductance loop. The low frequencies may comprise a frequency below 200 GHz, in particular below 100 GHz, in particular below 50 GHz, in particular below 20 GHz, in particular below 10 GHz, in particular below 5 GHz, in particular below 2 GHz, in particular below 1 GHz, or below 0.5 GHz.

The high-temperature superconducting qubit may be adapted to be operable when an external magnetic field at the Josephson junction and/or an external magnetic flux through the inductance loop is zero. Alternatively or in addition, the Josephson junction may be adapted to provide the quantum mechanical two-level system of the high-temperature superconducting qubit when an external magnetic field at the Josephson junction and/or an external magnetic flux through the inductance loop is zero.

The high-temperature superconducting qubit advantageously enables implementations of a qubit adapted for an operation at a low magnetic field, for example at an external magnetic flux of zero, such as an external magnetic flux through the inductance loop of zero. Therefore, additional components for generating and/or controlling an external magnetic field may be avoided. The corresponding qubit may be established with the inductance loop coupled to the Josephson junction of the high-temperature superconducting qubit. The operation at the low external magnetic field or at the external magnetic flux of zero may further reduce the sensitivity of the qubit to ambient noise and/or to uncontrolled fluctuations, which may, for example, be related to thermal fluctuations and/or fluctuations of fields such as electromagnetic fields. A coherence time and/or noise characteristics of the qubit may therefore be improved, resulting in a quiet qubit, respectively. The qubit may be a fluxonium qubit, in particular $\pi$ fluxonium qubit.

An electrical inductance of the inductance loop may be larger than an electrical inductance of the Josephson junction. In particular, the inductance loop may comprise superconducting material. The superconducting material may be a high-temperature superconductor or low-temperature superconductor, for example an elemental superconductor. The elemental superconductor may be a superconductor wherein superconductivity is provided by a single chemical element, in particular a superconductor composed of the single chemical element.

The high-temperature superconducting qubit according to the invention may comprise a low-temperature superconductor, for example in structured components such as the inductance loop, to make use of established fabrication and structuring techniques for low-temperature superconductors. The Josephson junction between high-temperature superconducting materials may provide an enhanced operation temperature of the high-temperature superconducting qubit in embodiments wherein the high-temperature superconducting qubit comprises the low-temperature superconductor.

The inductance loop may have a shape of a closed curve with an interruption. For example, the closed curve with the interruption may comprise or be a circular or elliptical ring with a gap, or be any other shape maintaining a loop geometry. The inductance loop may comprise and/or provide two inductance loop contacts. In embodiments wherein the inductance loop has the shape of a closed curve with an interruption, the two inductance loop contacts may correspond to sections of the closed curve closest to the interruption.

The inductance loop may further comprise at least one additional Josephson junction. In particular, the at least one additional Josephson junction may be adapted to increase an inductance of the inductance loop. The at least one additional Josephson junction may comprise or be a Josephson junction according to the present disclosure. Alternatively, the at least one additional Josephson junction may be or comprise a conventional Josephson junction. In particular, the additional Josephson junction may be or comprise a low-temperature superconductor junction, for example a low-temperature superconductor junction comprising at least one elemental superconductor.

The inductance loop may be coupled to the Josephson junction via a contact element. The contact element may comprise or be composed of a metal and/or a conductive material. For example, the contact element may comprise gold. The contact element may comprise a contact adhesion material such as titanium or tantalum or a corresponding nitride. The contact element may be adapted to provide superconductive current transport when the temperature of the Josephson junction is below the critical temperature of the Josephson junction. In particular, the superconductive current transport may be mediated by proximity effects associated with the first superconductor and/or the second superconductor.

The first high-temperature superconductor material and/or the second high-temperature superconductor material may comprise or be a d-wave superconductor. The first high-temperature superconductor material and/or the second high-temperature superconductor material may comprise a d-wave superconducting gap and/or be adapted for d-wave pairing. The d-wave superconductor may provide an order parameter with a d-wave symmetry. The first orientation and/or the second orientation may be associated with the order parameter and/or the d-wave symmetry of the order parameter. The second high-temperature superconductor material may be characterized by features corresponding to the ones described in the context of the first high-temperature superconductor material.

The d-wave superconductor may advantageously support the providing the quantum mechanical two-level system. For example, the quantum mechanical two-level system may be associated with a Josephson coupling between a d-wave superconductor of the first high-temperature superconductor material and a d-wave superconductor of the second high-temperature superconductor material. In particular, in embodiments with the inductance loop, the d-wave super-conductor and the inductance loop synergetically support the implementation of the qubit adapted for the operation at the external magnetic flux through the inductance loop of zero, in particular of the fluxonium qubit and/or the π fluxonium qubit.

The first high-temperature superconductor material and/or the second high-temperature superconductor material may comprise or be a type-II superconductor.

The first high-temperature superconductor material and/or the second high-temperature superconductor material may have a critical temperature of at least 4 K, in particular at least 8 K, in particular at least 15 K, in particular at least 30 K, in particular at least 50 K, in particular at least 70 K, in particular at least 78 K.

High-temperature superconductor materials with one or all of the features laid out above may advantageously provide the improved superconducting material properties, in particular a critical temperature exceeding the one of a low-temperature superconductor.

According to an embodiment, the first high-temperature superconductor material at the first surface corresponds to a first bulk material corresponding to the first superconductor, in particular wherein a chemical composition of the first high-temperature superconductor material at the first surface is identical with a chemical composition of the first bulk material, and/or a crystalline structure of the first high-temperature superconductor material at the first surface is identical with a crystalline structure of the first bulk material. Alternatively or in addition, the second high-temperature superconductor material at the second surface may correspond to a second bulk material corresponding to the second superconductor. In particular, a chemical composition of the second high-temperature superconductor material at the second surface may be identical with a chemical composition of the second bulk material, and/or a crystalline structure of the second high-temperature superconductor material at the second surface may be identical with a crystalline structure of the second bulk material. Alternatively, or in addition, the first (second) bulk material may correspond to the first (second) high-temperature superconductor material.

The superconducting junction properties and hence the superconducting qubit properties may be strongly influenced by the first (second) high-temperature superconductor material at the first (second) surface. In particular, they may be influenced more strongly by the first (second) high-temperature superconductor material at the first (second) surface than by first (second) high-temperature superconductor material further away from the first (second) surface. Problems in the state-of-the-art related to implementing a high-temperature superconducting qubit may be associated with the first (second) high-temperature superconductor material at the first (second) surface, which may differ from a bulk material corresponding to the first (second) superconductor, for example in chemical composition, crystalline structure and/or superconducting device properties. For example, the first (second) high-temperature superconductor material at the first (second) surface according to the state-of-the-art may have a lower critical temperature and/or critical current than the bulk material corresponding to the first (second) superconductor. For example, the first (second) high-temperature superconductor material at the first (second) surface may have been altered in a fabrication process of the Josephson junction. Embodiments of the disclosure, such as the disclosed method of fabricating a qubit element, may improve the first (second) high-temperature superconductor material at the first (second) surface, resulting in superconducting material properties similar or identical to the ones of the corresponding bulk material, thus improving the superconducting qubit properties. In particular, a coherence of a wave function related to the quantum mechanical two-level system and/or of the first and/or second quantum mechanical state may be improved by the homogeneity of bulk and surface material, improving the coherence of the high-temperature superconducting qubit.

The first high-temperature superconductor material at the first surface may comprise first high-temperature superconductor material within a distance of 6 nm from the first surface, in particular within 3 nm from the first surface, in particular within 1.5 nm from the first surface, in particular within 1 nm from the first surface, in particular within 0.5 nm from the first surface, in particular within 0.3 nm from the first surface. The second high-temperature superconductor material at the second surface may be specified accordingly.

In embodiments wherein the first high-temperature superconductor material is BSCCO, the chemical composition of the first high-temperature superconductor material at the first surface may be associated with an n of the first high-temperature superconductor material at the first surface, and/or the chemical composition of the first bulk material may be associated with an n of the first bulk material. In particular, the n of the first high-temperature superconductor material at the first surface may be identical with the with n of the first bulk material. In particular, in embodiments wherein n=2 of the first bulk material, the first high-temperature superconductor material at the first surface may not comprise BSCCO with an n different from 2, in particular not with n=3.

The second surface may be characterized by features corresponding to the ones described in the context of the first surface.

The first section may be characterized by features corresponding to the ones described in the context of the first surface.

The second section may be characterized by features corresponding to the ones described in the context of the first surface.

Problems related to the implementation of Josephson junctions comprising BSCCO may be associated with a change of an oxygen content and/or of an n of the BSCCO at the surface. For example, these conventional fabrication techniques may apply elevated temperatures exceeding room temperature. The fabrication method and the Josephson junction according to the disclosure avoid the changes, and successfully implement a high-temperature superconducting qubit.

According to embodiments, the first bulk material may form a majority of the first superconductor. The second bulk material may form a majority of the second superconductor. In this context, the majority may refer to a mass fraction of at least 50%, in particular at least 70%, in particular of at least 90%, in particular of at least 95%, and in particular of at least 99%.

According to embodiments, the Josephson junction may be a Josephson junction between the first high-temperature superconductor material at the first surface and the second high-temperature superconductor material at the second surface.

According to embodiments, the Josephson junction may be a Josephson junction between the first surface and the second surface. In particular, the Josephson junction may be a Josephson junction between the first section of the first surface and the second section of the second surface. For example, the Josephson junction may be formed in the overlap region.

The first bulk material may further be characterized by features corresponding to the ones described in the context of the first high-temperature superconductor material and/or the second high-temperature superconductor material.

The second bulk material may be characterized by features corresponding to the ones described in the context of the first bulk material. According to embodiments, the first bulk material may be a same bulk material as the second bulk material.

The first high-temperature superconductor material may comprise an element of the sixth main group of the periodic table of the elements, such as oxygen or a chalcogenide. The first high-temperature superconductor material at the first surface may have a content of the element of the sixth main group of the periodic table of the elements corresponding to a content of the element of the sixth main group of the periodic table of the elements of the first bulk material.

The second high-temperature superconductor material at the second surface may be characterized by features corresponding to the ones described in the context of the first high-temperature superconductor material at the first surface.

Problems in the state of the art to implement a high-temperature superconducting qubit may be related to the content of the element of the sixth main group at the surface. For example, surfaces comprising an element of the sixth main group, such as oxygen, may be prone to chemical reactions, in particular at room temperature and higher temperatures, for example with solvents such as water and/or organic solvents. The chemical reactions may alter the content of the element of the sixth main group at the surface, resulting in a degradation of the superconducting material properties at the surface. The high-temperature superconducting qubit according to the present disclosure may solve this problem and therefore improve the superconducting junction properties and the superconducting qubit properties.

According to an embodiment, a critical current of the Josephson junction relative to a critical current of a first bulk material corresponding to the first superconductor or relative to a critical current of a second bulk material corresponding to the second superconductor is at least 0.05%, in particular at least 0.075%, or at least 0.1%, in particular at least 0.5%, in particular at least 1%, or at least 1.5%, or at least 2%, or at least 3%, or at least 5%, or at least 10%, or at least 20%, or at least 40%. Alternatively or in addition, the first (second) bulk material may correspond to the first (second) high-temperature superconductor material.

The critical current of the first bulk material may be at least 10 A/cm$^2$, in particular at least 100 A/cm$^2$, in particular at least 500 A/cm$^2$, in particular at least 1200 A/cm$^2$. For example, the first bulk material may be BSCCO and the critical current of the first bulk material may be 1240 A/cm$^2$.

According to an embodiment, a critical temperature of the Josephson junction relative to a critical temperature of the first bulk material corresponding to the first superconductor or relative to a critical temperature of the second bulk material corresponding to the second superconductor is at least 0.5%, in particular at least 1%, in particular at least 5%, in particular at least 20%, in particular at least 25%, in particular at least 65%, in particular at least 70%, in particular at least 75%, in particular at least 80%, in particular at least 85%, in particular at least 90%, or at least 95%. In particular, the Josephson junction may be adapted to exhibit a single critical temperature. The single critical temperature may be associated with a single discontinuity of a resistance of the Josephson junction as a function of temperature.

According to embodiments, a critical temperature of the Josephson junction is at least 0.4 K, in particular at least 1 K, in particular at least 8 K, in particular at least 15 K, in particular at least 30 K, in particular at least 50 K, in particular at least 60 K, in particular at least 65 K, in particular at least 70 K, in particular at least 75 K, in particular at least 78 K, in particular at least 80 K.

The high critical temperature of the Josephson junction may permit an operation of the high-temperature superconducting qubit at an elevated temperature, for example compared to an operation temperature of a qubit with a low-temperature superconductor Josephson junction. This may reduce technological effort and costs of operating the high-temperature superconducting qubit. Moreover, a read and write speed or frequency of a qubit comprising the Josephson junction may be improved, for example as a result of an enhanced superconducting gap, critical current and/or junction quality factor. In particular, the high critical temperature of the Josephson junction may be associated with the improved first (second) high-temperature superconductor material at the first (second) surface. The improved material quality at the surface increases the critical temperature of the Josephson junction to a value similar to the one of a critical temperature a corresponding bulk material. The qubit according to the disclosure therefore solves problems from the state of the art, wherein a high-temperature superconductor Josephson junction may exhibit a lower critical temperature and/or more than a single critical temperature, which may be related to a high-temperature superconductor material at a surface. This may also result in an improved critical current of the Josephson junction according to the disclosure.

The critical temperature of the Josephson junction may correspond to a minimum temperature of the Josephson junction at which the Josephson junction is adapted to support a superconducting current. In particular, the superconducting current may comprise a superconducting current from the first high-temperature superconductor material to the second high-temperature superconductor material.

According to embodiments wherein the first high-temperature superconductor material is BSCCO and wherein the BSCCO has chemical composition described by a single $Bi_2Sr_2Ca_{n-1}Cu_nO_{2n+4+x}$, the critical temperature of the first bulk material may be 33 K for n=1 or 96 K for n=2 or 108 K for n=3 or 104 K for n=4.

According to embodiments, a variation of the distance is at most 0.3 nm, in particular at most 0.2 nm, in particular at most 0.1 nm, in particular at most 0.05 nm; and/or a roughness of the first section is at most 0.3 nm, in particular at most 0.2 nm, in particular at most 0.1 nm, in particular at most 0.05 nm; and/or a roughness of the second section is at most 0.3 nm, in particular at most 0.2 nm, in particular at most 0.1 nm, in particular at most 0.05 nm.

The high-temperature superconducting qubit according to the invention provides a reduced variation of the distance and/or roughness of the sections of the surface, which may be associated with the improved the first (second) high-temperature superconductor material at the first (second) surface. The reduced variation of the distance and/or roughness of the sections of the surface may improve a coherence of a wave function related to the quantum mechanical two-level system and/or of the first and/or second quantum mechanical state. This may improve the superconducting junction properties and the superconducting qubit properties, and/or be beneficial to overcome problems in the state of the art related to implementing the high-temperature superconducting qubit.

According to embodiments, the high-temperature superconducting qubit may further comprise a spacer material between the first superconductor and the second superconductor, in particular a spacer material between the first section and the second section.

The spacer material may comprise a semiconductor or a dielectric material. The spacer material may have a single particle bandgap and/or a thickness adapted to adjust a tunnel barrier of the Josephson junction. According to embodiments, the thickness of the spacer material in the overlap region varies by at most 0.3 nm, in particular by at most 0.2 nm, in particular by at most 0.1 nm, in particular by at most 0.05 nm.

The spacer material may comprise a third layered crystal structure.

The spacer material may be adapted to chemically passivate the first surface and/or the second surface, in particular the first section of the first surface and/or the second section of the second surface. For example, the spacer material may be impermeable to a reactive species, such as oxygen and/or chalcogenides and/or water and/or organic solvent. For example, the spacer material may be arranged to fully cover the first section of the first surface and/or the second section of the second surface, in particular to fully cover the first surface and/or the second surface.

According to embodiments, the spacer material is not a superconductor material. Alternatively, the spacer material may be a superconductor material with a critical temperature smaller than the critical temperature of the Josephson junction, in particular smaller by at least a factor of two, in particular smaller by at least a factor of five.

Because of the short-range nature of the tunneling current in the Josephson junction, the high-temperature superconducting qubit may be sensitive to variations in the distance. The spacer material may improve the variation of the distance. The improved variation of the distance may therefore improve the performance of the high-temperature superconducting qubit. The improved variation of the distance may be achieved, for example, by reducing reactions between a surface and a chemical, for example between the first (second) surface and a solvent, as described above in the context of the element of the sixth main group of the periodic table of the elements. The improved variation of the distance may also be achieved by applying a cleaving process in the fabrication of the first and/or second surface.

The spacer material may further improve the variation of the distance by providing a homogeneous thickness. The spacer material may further permit a distance larger than a distance that would be achieved without the spacer material.

The first high-temperature superconductor material may comprise a first primary lattice vector, and the first orientation may be associated with the first primary lattice vector. The first primary lattice vector may be a primitive lattice vector of the first high-temperature superconductor material. The first orientation may be associated with a projection of the first primary lattice vector onto the first surface. The first primary lattice vector may be essentially parallel to the first surface. The first primary lattice vector may be a reciprocal lattice vector of the first crystalline high-temperature superconductor material.

The second orientation may be associated with a second primary lattice vector of the second high-temperature superconductor material. The second primary lattice vector may be characterized by features corresponding to the ones described in the context of the first primary lattice vector.

Associating the first (second) orientation with lattice vectors gives control over the first (second) orientation using developed techniques, such as microscopic, goniometric or diffraction techniques, in particular x-ray diffraction and/or electron diffraction.

According to an embodiment, the first high-temperature superconductor material and the second high-temperature superconductor material have a same Bravais lattice, a same crystal system and/or a same crystal structure, and the first primary lattice vector and the second primary lattice vector are corresponding lattice vectors associated with the same Bravais lattice, the same crystal system and/or the same crystal structure.

According to embodiments, the predefined angle corresponds to an angle between a first orbital of the first high-temperature superconductor material and a second orbital of the second high-temperature superconductor material. In particular, the first orbital and/or the second may be a d-type orbital.

The predefined angle may be different from zero, in particular essentially larger than zero.

Alternatively or in addition, the predefined angle may correspond to an angle between a direction of a first nodal point of a Fermi surface of the first high-temperature superconductor material and a direction of a second nodal point of a Fermi surface of the second high-temperature superconductor material.

In particular, the predefined angle may be selected to suppress a propagation of non-superconducting charge carriers between the first high-temperature superconductor material and the second high-temperature superconductor material. For example, the non-superconducting charge carriers may be electrons and/or holes.

According to embodiments of the invention, the predefined angle and/or the central predefined angle may correspond to an integer fraction of an angle between a first primary lattice vector and a first secondary lattice vector of the first high-temperature superconductor material, in particular wherein the first primary lattice vector corresponds to a first primitive lattice vector of the first high-temperature superconductor material and/or the first secondary lattice vector corresponds to a second primitive lattice vector of the first high-temperature superconductor material different from the first primitive lattice vector. For example, the fraction may be one half. In particular, the first primitive lattice vector and the second primitive lattice vector may both be parallel to the first surface. For example, the predefined angle and/or the central predefined angle may be 45 degrees, in particular in embodiments wherein the angle between the first primary lattice vector and a first secondary lattice vector is 90 degrees.

Such a predefined angle, in particular such a range of the predefined angle, may provide a current filter. The current filter may result in a reduced dissipation of the Josephson junction. The reduced dissipation may improve a coherence time of a qubit comprising the Josephson junction.

According to embodiments, the first high-temperature superconductor material is anisotropic, for example in terms of its mechanical, optical, or electronic properties. The first high-temperature superconductor material may have a first c-axis, wherein the first c-axis is associated with a distinct direction of the anisotropic high-temperature superconductor material. The first high-temperature superconductor material may have a first layered structure. The first c-axis may be perpendicular to a layer of the first layered structure. A layer of the first layered structure may be essentially parallel to the first section of the first surface. In particular, the first layered structure may be a first layered crystal structure, and a crystal plane of the first layered crystal structure may be essentially parallel to the first section of the first surface. In particular, the layer may be a first superconducting plane, a second plane, or a third plane. The second high-temperature superconductor material may be characterized by corresponding features.

The first layered structure and/or the second layered structure may comprise a first superconducting plane corresponding to a layer of the first layered structure. The first superconducting plane may be adapted to provide a superconductivity of the first layered structure and/or the second layered structure. In particular, the first superconducting plane may be adapted to provide the superconductivity along the first superconducting plane. According to embodiments with a transition metal oxide, a transition metal chalcogenide, or with a pnictide, the first superconducting plane may comprise the transition metal oxide, the transition metal chalcogenide, or the pnictide.

The first layered structure and/or the second layered structure may further comprise a second plane which corresponds to a layer of the first layered structure and is different from the first superconducting plane. The first section of the first surface and/or the second section of the second surface may be formed by a second plane.

The first layered structure and/or the second layered structure may further comprise a third plane corresponding to a layer of the first and/or second layered structure. The third plane may be different from the first superconducting plane. According to a bulk structure of the first layered structure and/or the second layered structure, the third plane may be adjacent to and/or parallel to the second plane. The bulk structure may be a bulk crystal structure. According to the bulk structure of the first layered structure and/or the second layered structure, the second plane and the third plane may be separated by a van der Waals gap. The van der Waals gap may have a layer spacing of at least 0.15 nm, in particular of at least 0.25 nm, in particular of at least 0.3 nm, in particular at least 0.35 nm, in particular at least 0.4 nm, in particular at least 0.45 nm, in particular at least 0.5 nm. According to embodiments of the invention, the third plane may have a chemical composition identical to a chemical composition of the second crystal plane.

The first (second) layered structure may ensure that a first superconducting plane which is closer to the first (second) surface than other first superconducting planes contributes stronger to a tunneling current through the Josephson junction than other first superconducting planes which are further away from the first (second) surface.

Either of the first superconducting plane, the second plane and third plane may provide a van der Waals gap in combination with an adjacent layer of the first and/or second layered structure. The van der Waals gap may advantageously improve a cleaving of the first (second) high-temperature superconductor material, which may improve the quality of the first (second) surface. For example, a reliability of the cleaving may be improved, or a roughness of a resulting first (second) surface may be eased.

The distance may be associated with a distance, in particular with a van der Waals gap, between a plane of the first high-temperature superconductor material closest to the first section of the first surface and a plane of the second high-temperature superconductor material closest to the second section of the second surface. In particular, the plane of the first high-temperature superconductor material closest to the first section of the first surface may be a first superconducting plane or second plane or a third plane of the first high-temperature superconductor material. The plane of the second high-temperature superconductor material closest to the second section of the second surface may be a first superconducting plane or second plane or a third plane of the second high-temperature superconductor material.

The first high-temperature superconductor material at the first surface may comprise the first high-temperature superconductor material of two layers of the first layered crystal structure closest to the first surface, in particular of a layer of the first layered crystal structure closest to the first surface, in particular of a half of the layer of the first layered crystal structure closest to the first surface, in particular of a third of the layer of the first layered crystal structure closest to the first surface.

In embodiments with a first superconducting plane, the first high-temperature superconductor material at the first surface may comprise the first high-temperature superconductor material of the first superconducting plane closest to the first surface.

In embodiments with a second plane, the first high-temperature superconductor material at the first surface may comprise the first high-temperature superconductor material of the second plane closest to the first surface.

In embodiments with a third plane, the first high-temperature superconductor material at the first surface may comprise the first high-temperature superconductor material of the third plane closest to the first surface.

In embodiments wherein the first high-temperature superconductor material has the first layered structure, the first primary lattice vector may be parallel to a layer of the first layered structure. In particular, in embodiments wherein the first high-temperature superconductor material has the first layered crystal structure, the first primary lattice vector may be parallel to a layer of the first layered crystal structure, wherein the layer is associated with a crystal plane of the first layered crystal structure. In embodiments with a first superconducting plane, the first superconducting plane may be a first crystal plane. The first primary lattice vector may be essentially parallel to the first crystal plane. In embodiments with a second plane, the second plane may be a second crystal plane. The first primary lattice vector may be essentially parallel to the second crystal plane. In embodiments with a third plane, the third plane may be a third crystal plane. The first primary lattice vector may be essentially parallel to the third crystal plane. In particular, the first orientation may correspond to a projection of the first primary lattice vector onto the first surface.

The second high-temperature superconductor material may be characterized by features corresponding to the ones described in the context of the first high-temperature superconductor material.

The first high-temperature superconductor material may comprise a transition metal chalcogenide and/or a transition metal oxide, in particular a copper oxide. Alternatively or in addition, the first high-temperature superconductor material may comprise a pnictide. In particular, the first high-temperature superconductor material may comprise or be a cuprate superconductor material and/or a pnictide superconductor material.

The first high-temperature superconductor material and/or the second high-temperature superconductor material may comprise or be composed of BSCCO.

BSCCO may comprise bismuth, strontium, copper, and oxygen. In addition, BSCCO may comprise calcium. According to embodiments, BSCCO may be composed of bismuth, strontium, copper, and oxygen. Alternatively, BSCCO may be composed of bismuth, strontium, calcium, copper, and oxygen. In particular, BSCCO may comprise a material or a combination of materials with chemical compositions each described by $Bi_2Sr_2Ca_{n-1}Cu_nO_{2n+4+x}$ with a corresponding n and a corresponding x, wherein n may denote an integer, in particular n may be 1, 2, 3, or 4 and/or wherein x may be a positive number, in particular x may be in a range from 0.1 to 0.3. According to embodiments, BSCCO is a chemically homogeneous material with a single chemical composition described by a single $Bi_2Sr_2Ca_{n-1}Cu_nO_{2n+4+x}$, and/or with a single n and/or a single x, respectively.

BSCCO may provide a plurality of advantageous features described above in the context of the first (second) high-temperature superconductor material and/or the first (second) layered structure. For example, BSCCO may provide a first superconducting plane providing superconductivity, the first superconducting plane comprising a copper oxide. BSCCO may further provide a second plane providing a tunnel barrier. BSCCO may further provide a third plane, providing a van der Waals gap together with an adjacent second plane. The parameters n and x may serve to adjust the properties of BSCCO to the requirements of the specific application. Depending on the requirements of the specific application, however, a different first (second) high-temperature superconductor material may have advantages, in particular for providing selected superconducting material properties, selected mechanical properties, or selected forming and/or surface preparation methods. A plurality of high-temperature superconductor materials are known from the state-of-the-art, and any or a combination of them may be applied as a first (second) high-temperature superconductor material in the context of the present disclosure.

The first high-temperature superconductor material and/or the second high-temperature superconductor material may comprise an element of the sixth main group of the periodic table of the elements, in particular oxygen. Alternatively or in addition, the first high-temperature superconductor material and/or the second high-temperature superconductor material may comprise an oxide and/or a chalcogenide.

A concentration of the element of the sixth main group of the periodic table of the elements may be used for doping the first and/or second high-temperature superconductor material, permitting to adjust and/or optimize its superconducting material properties. In embodiments wherein the first and/or second high-temperature superconductor material is crystalline, atomic positions of the element of the sixth main group of the periodic table of the elements, in particular of the oxygen, may be at least partially aperiodic. In particular, atomic positions of the element of the sixth main group of the periodic table of the elements associated with doping the first and/or second high-temperature superconductor material may be at least partially aperiodic.

According to embodiments, the first high-temperature superconductor material and/or the second high-temperature superconductor material may consist of a chemically homogeneous material with a single chemical composition.

The first surface may have an area of at least $100$ nm$^2$, in particular or at least $0.01$ $\mu$m$^2$ or of in particular or at least $1$ $\mu$m$^2$, in particular of at least $10$ $\mu$m$^2$, in particular of at least $20$ $\mu$m$^2$, in particular of at least $40$ $\mu$m$^2$, in particular of at least $60$ $\mu$m$^2$, in particular of at least $80$ $\mu$m$^2$, in particular of at least $100$ $\mu$m$^2$. The first surface may have an area of at most $1$ mm$^2$.

An optimized area of the first (second) surface may provide an optimized total critical current, and optimized coherence and/or an optimized capacitance of the Josephson junction.

In the context of the present disclosure, the first section of the first surface and the second section of the second surface may be understood to overlap if a line perpendicular to the first section of the first surface and/or to the second section of the second surface exists such that the line intersects both the first section of the first surface and the second section of the second surface.

According to embodiments of the invention, the predefined distance may be at least $0.2$ nm, in particular at least $0.25$ nm, in particular at least $0.3$ nm, in particular at least $0.35$ nm, in particular at least $0.4$ nm, in particular at least $0.45$ nm, in particular at least $0.5$ nm.

According to embodiments of the invention, the predefined distance may be at most $10$ nm, in particular at most $8$ nm, in particular at most $6$ nm, in particular at most $4$ nm, in particular at most $3$ nm, in particular at most $2$ nm, in particular at most $1$ nm.

Corresponding distances may improve the Josephson. In particular, the distance may be selected for a current through the Josephson junction to comprise or be a tunneling current, in particular a superconducting tunneling current.

According to embodiments of the invention, the predefined angle may be in a range of $\pm 3$ degrees around a central predefined angle, in particular in a range of $\pm 2$ degrees around the central predefined angle, in particular in a range of $\pm 1$ degree around the central predefined angle.

According to embodiments with a c-axis, the predefined angle may be associated with an angle and/or a rotation around the c-axis.

The Josephson junction may comprise a tunnel junction between the first high-temperature superconductor material and the second high-temperature superconductor material. In particular, the tunnel junction may be a tunnel junction for charges associated with a supercurrent through the junction, in particular Cooper pairs. In embodiments with a first layered structure, the tunnel junction may comprise a layer of the first layered structure, in particular the first superconducting plane of the first layered structure closest to the first surface. In such embodiments, a tunneling direction of the tunnel junction may be perpendicular to the first superconducting plane of the first layered structure closest to the first surface. Alternatively or in addition, the tunneling direction may be essentially parallel to a c-axis. In embodiments with a second layered crystal structure, the tunnel junction may comprise a layer of the second layered crystal structure, in particular the first superconducting plane of the second layered crystal structure closest to the second surface. In such embodiments, a tunneling direction of the tunnel junction may be perpendicular to the first superconducting plane of the second layered crystal structure closest to the second surface.

Alternatively or in addition, the Josephson junction may comprise a weak link between the first high-temperature superconductor material and the second high-temperature superconductor material.

According to embodiments, the Josephson junction is adapted to exhibit a Josephson effect, in particular a DC Josephson effect and/or an AC Josephson effect and/or an inverse AC Josephson effect.

In particular, the Josephson junction may be adapted to exhibit Shapiro steps. In particular, the Shapiro steps may correspond to plateaus in a current-voltage characteristic of the Josephson junction recorded using an AC voltage. For example, a frequency of the AC voltage may be in a microwave frequency range. In this context, the microwave frequency range may correspond to a frequency range from 0.3 GHz to 300 GHz, in particular from 1 GHz to 100 GHz.

The implementation of the Josephson junction is beneficial for establishing the high-temperature superconducting qubit. In particular, modes of operation of existing high temperature superconducting qubits comprising superconductor junctions are considered to rely on the implementation of the Josephson junction.

According to embodiments, a thickness of the first and/or second superconductor in the overlap region is at most 300 nm, in particular at most 200 nm, in particular at most 100 nm, in particular at most 50 nm, in particular at most 30 nm, in particular at most 20 nm, in particular at most 10 nm, in particular at most 5 nm.

According to embodiments, a thickness of the first and/or second high-temperature superconductor material in the overlap region may be at most 300 nm, in particular at most 200 nm, in particular at most 100 nm, in particular at most 50 nm, in particular at most 30 nm, in particular at most 20 nm, in particular at most 10 nm, in particular at most 5 nm.

A corresponding minimum thickness may ensure a tunneling current in the Josephson junction. Because of the short-range nature of the tunneling current in the Josephson junction, a limited amount of material of the first (second) high-temperature superconductor material may be sufficient to establish the Josephson junction, in particular a limited amount in terms of a limited thickness. The limited amount of material may minimize the number of electrons associated with superconducting behavior of the first (second) high-temperature superconductor material, which may improve and/or increase a coherence time of a qubit comprising the Josephson junction. Moreover, the limited amount of material may minimize a number of defects of the first (second) high-temperature superconductor material, which may improve the coherence time of the qubit comprising the Josephson junction further. The limited thickness may also improve a thermal homogeneity of the first (second) high-temperature superconductor material and/or a temperature of the first (second) surface sufficiently low to support superconducting behavior.

According to an embodiment, the first high-temperature superconductor material is BSCCO, the second high-temperature superconductor material is BSCCO, and the predefined angle is in the range from 43 to 47 degrees or in the range from −2 to 2 degrees. In particular, the BSCCO may comprise or be BSCCO with n=2.

The high-temperature superconducting qubit may further comprise a microwave resonator and at least one resistor coupled to the microwave resonator. The microwave resonator may be adapted to act as an antenna for a microwave signal adapted for readout and/or control of the quantum mechanical two-level system. The microwave resonator may be coupled to the Josephson junction and/or to the inductance loop. The microwave resonator may be adapted to couple the microwave signal to the quantum mechanical two-level system. The at least one resistor may be adapted to provide a readout signal and/or a control signal associated with the quantum mechanical two-level system quantum mechanical two-level system.

The microwave resonator and the at least one resistor permit control and read out the qubit. This may support the integration of the high-temperature superconducting qubit into a quantum computer, which may solve certain classes of problems faster than a classical computer, wherein a bit of the classical computer may only assume an integer number of states, in particular only two states. The qubit may also be applied in metrology, such as for magnetic field sensing.

The microwave resonator may be coupled capacitively to the Josephson junction and/or to the inductance loop. For example, at least a section of the microwave resonator may be arranged in close proximity to a portion of the Josephson junction and or of the inductance loop.

The microwave resonator may be adapted to provide a resonance frequency in the microwave frequency range. The microwave resonator may comprise at least one electrically conductive wire, in particular two electrically conductive wires arranged in parallel to each other. A length and/or a shape of the conductive wire may be adapted to provide the resonance frequency in the microwave frequency range.

A material composition of the microwave resonator and/or of the at least one electrically conductive wire may be characterized by features corresponding to the features described in the context of the material composition of the inductance loop. In particular, the microwave resonator and/or the at least one electrically conductive wire may be composed of a same material as the inductance loop.

The at least one resistor may be capacitively coupled to the microwave resonator. The at least one resistor may be adapted to support an electrical readout of the microwave resonator. In particular, the at least one resistor may be adapted to provide a measure associated with a microwave power in the microwave resonator. Alternatively or in addition, the at least one resistor may comprise exactly two resistors, in particular exactly two resistors with a symmetrical arrangement with respect to a portion of the microwave resonator.

In a second aspect, the disclosure relates to a method for fabricating a qubit element for a high-temperature superconducting qubit, wherein the method comprises forming a first surface of a first high-temperature superconductor material of a first superconductor, forming a second surface of a second high-temperature superconductor material of a second superconductor, and arranging the first surface and the second surface to form an overlap region. The first high-temperature superconductor material comprises a first orientation. The second high-temperature superconductor material comprises a second orientation. The first surface and the second surface are arranged to form the overlap region, such that in the overlap region at least a first section of the first surface and at least a second section of the second surface overlap, the first section and the second section are parallel at a distance corresponding to a predefined distance, and an angle between the first orientation and the second orientation corresponds to a predefined angle. The method is characterized in that it further comprises, during the process steps of forming the first surface, forming the second surface, and/or arranging the first surface and the second surface to form the overlap region, cooling a temperature of the first surface and/or a temperature of the second surface to below 250 K.

Cooling the temperature of the first (second) surface may prevent altering the first (second) high-temperature superconductor material at the first (second) surface. Consequently, the qubit element may provide an improved critical temperature, critical current, critical magnetic field, and/or quality factor as laid out above in the context of the first (second) high-temperature superconductor material at the first (second) surface. In particular, cooling the temperature of the first (second) surface may ensure that the first (second) high-temperature superconductor material at the first (second) surface corresponds to a bulk material corresponding to the first superconductor.

In particular, the cooling the temperature of the first surface and/or the temperature of the second surface may comprise cooling the temperature of the first surface and/or the temperature of the second surface to below 230 K, in particular to below 210 K, in particular to below 190 K, in particular to below 170 K, in particular to below 150 K.

In particular, the method may comprise the cooling the temperature of the first surface during an entire time interval from the forming of the first surface and/or the forming of the second surface until the arranging of the first surface and the second surface to form the overlap region, in particular until the arranging the first surface and the second surface to form the overlap region is completed. In particular, a duration of the entire time interval may be at most 15 minutes, in particular at most 10 minutes, in particular at most 8 minutes, in particular at most 4 minutes, in particular at most 3 minutes, in particular at most 2 minutes, in particular at most 1 minute.

Alternatively, the method may comprise the cooling the temperature of the first surface during an entire time interval from the forming of the first surface and/or the forming of the second surface until the process step of the arranging of the first surface and the second surface to form the overlap region is started.

The method may further comprise increasing a temperature of the first superconductor in the process step of arranging the first surface and the second surface to form the overlap region, in particular increasing the temperature of the first superconductor by at most 10 K, or by at most 20 K, or by at most 30 K, or by at most 40 K, or by at most 50 K, or by at most 60 K.

In particular, a duration of the entire time interval may be at most 15 minutes, in particular at most 10 minutes, in particular at most 8 minutes, in particular at most 4 minutes, in particular at most 3 minutes, in particular at most 2 minutes, in particular at most 1 minute. A duration from increasing the temperature of the first superconductor and/or increasing the temperature of the second superconductor until completing the arranging the first surface and the second surface to form the overlap region may be at most 4 minutes, in particular at most 3 minutes, in particular at most 2 minutes, in particular at most 1 minute, in particular at most 30 seconds, in particular at most 20 seconds.

Moderate heating of the first superconductor may provide means to adjust an adhesion of an adhesive associated with the method of fabricating the qubit element. Keeping the increase of the temperature of the first superconductor associated with the heating below the given values, or the time interval of the heating below the given values may prevent altering the first (second) high-temperature superconductor material at the first (second) surface.

The method may comprise corresponding process steps with respect to the temperature of the second surface.

The arranging the first surface and the second surface to form the overlap region may comprise rotating the first high-temperature superconductor material and/or the second high-temperature superconductor material by a predefined rotation angle.

In embodiments wherein the first surface and the second surface are formed from a common starter material, they may automatically be initially aligned with respect to each other. Rotating by a predefined rotation angle provides an efficient way of adjusting the angle between the first orientation and the second orientation to the predefined angle in such embodiments.

Alternatively or in addition, the arranging the first surface and the second surface to form the overlap region may comprise identifying a crystallographic orientation of the first high-temperature superconductor material and/or the second high-temperature superconductor material, and/or rotating the first high-temperature superconductor material and/or the second high-temperature superconductor material by a rotation angle corresponding to the crystallographic orientation of the first high-temperature superconductor material and/or the second high-temperature superconductor material.

For example, identifying the crystallographic orientation of the first high-temperature superconductor material and/or the second high-temperature superconductor material may comprise using an x-ray technique, in particular an x-ray diffraction technique, an electron diffraction technique or a microscopy technique, in particular an electron microscopy technique or an optical microscopy technique. For example, identifying the crystallographic orientation of the first high-temperature superconductor material and/or the second high-temperature superconductor material may comprise identifying a real-space lattice vector, a reciprocal lattice vector, or a high-symmetry facet.

A corresponding identification of at least one crystallographic orientation may be used to implement a Josephson junction between a first high-temperature superconductor material with a first material composition and a second high-temperature superconductor material with a material composition different from the first material composition, or a heterostructure, respectively. The improved flexibility of the heterostructure in terms of material composition may provide additional flexibility in terms of manufacturing techniques and/or superconducting properties of the qubit element.

The arranging the first surface and the second surface to form the overlap region may comprise a lateral positioning of the first high-temperature superconductor material and/or the second high-temperature superconductor material. The arranging the first surface and the second surface to form the overlap region, in particular the lateral positioning and/or the rotating, may comprise a pick-and-place technique, in particular an at least partially robotic pick-and-place technique. The arranging the first surface and the second surface to form the overlap region, in particular the lateral positioning and/or the rotating, may comprise applying an optical technique to identify a measured lateral position of the first high-temperature superconductor material and/or the second high-temperature superconductor material, for example using a camera and/or a microscope. In embodiments with a pick-and-place technique, the pick-and-place technique may comprise using the measured lateral position of the first high-temperature superconductor material and/or the second high-temperature superconductor material. The arranging the first surface and the second surface to form the overlap region, in particular the rotating and/or the lateral positioning, in particular the pick-and-place technique, may further comprise holding the first high-temperature superconductor material and/or the second high-temperature superconductor material, in particular using an adhesive.

The method for fabricating the qubit element may comprise pick and place techniques developed in the state-of-the-art. In particular, the pick and place techniques according to the state-of-the-art may provide some degree of automatization and/or robotization, which may be adapted to the method of fabricating qubit element, for example for implementing a fully automatized or robotized method for fabricating the Josephson junction.

In particular, the adhesive may comprise or be composed of an elastomer. The adhesive may be adapted for holding the first high-temperature superconductor material and/or the second high-temperature superconductor material when a temperature of the adhesive is below a transition temperature, and for releasing the first high-temperature superconductor material and/or the second high-temperature superconductor material when the temperature of the adhesive is above the transition temperature. For example, the transition temperature may correspond to a melting temperature of the adhesive. The arranging the first surface and the second surface to form the overlap region, in particular the rotating and/or the lateral positioning, in particular the pick-and-place technique, may further comprise releasing the first high-temperature superconductor material and/or the second high-temperature superconductor material after holding the first high-temperature superconductor material and/or the second high-temperature superconductor material, in particular using the adhesive.

Using an elastomer as an adhesive may avoid a use of an adhesive comprising solvents, such as water or organic solvents. This may improve the performance of the Josephson junction and/or the qubit element, as laid out above in the context of the first (second) high-temperature superconductor material at the first (second) surface. Moreover, the elastomer may provide a joint which may be formed and released by controlling a temperature of the elastomer, for example by controlling a manipulator temperature and/or a temperature of the first and/or second superconductor, in particular the temperature of the first and/or the second surface.

According to embodiments, the method further comprises, during the process steps of forming the first surface, and/or forming the second surface, and/or arranging the first surface and the second surface to form the overlap region, controlling a partial pressure of water of an atmosphere adjacent to the first surface and/or the second surface, in particular controlling the partial pressure of water to be below 0.01 Pa, in particular below 0.001 Pa, in particular below 0.0001 Pa.

Keeping the partial pressure of water below a corresponding value may avoid altering the first (second) high-temperature superconductor material at the first (second) surface. This may improve the performance of the Josephson junction and/or the high-temperature superconducting qubit, as laid out above in the context of the first (second) high-temperature superconductor material at the first (second) surface.

The atmosphere adjacent to the first surface and/or the second surface may comprise a total pressure of at least $10^4$ Pa, in particular at least $5 \times 10^4$ Pa, in particular at least $9 \times 10^4$ Pa, in particular at least $10^5$ Pa. For example, the total pressure of the atmosphere adjacent to the first surface and/or the second surface may correspond to an environmental pressure, and/or exceed the environmental pressure by at most 5%, in particular by at most 3%, in particular by at most 1%.

The atmosphere adjacent to the first surface and/or the second surface may comprise a partial pressure of organic solvents below 0.01 Pa, in particular below 0.001 Pa, in particular below 0.0001 Pa.

Keeping the partial pressure of organic solvents below a corresponding value may avoid altering the first (second) high-temperature superconductor material at the first (second) surface. This may improve the performance of the Josephson junction and/or the high-temperature superconducting qubit, as laid out above in the context of the first (second) high-temperature superconductor material at the first (second) surface.

In particular, the method may comprise controlling the partial pressure of water of the atmosphere adjacent to the first surface during an entire time interval from the forming the first surface until the arranging of the first surface and the second surface to form the overlap region, in particular until the arranging of the first surface and the second surface to form the overlap region is completed. The method may comprise controlling the partial pressure of water of the atmosphere adjacent to the second surface during an entire time interval from the forming of the first surface until the arranging of the first surface and the second surface to form the overlap region, in particular until the arranging of the first surface and the second surface to form the overlap region is completed.

The method may further comprise placing a spacer material between the first section and the second section. In particular, the placing of the spacer material between the first section and the second section may be performed after forming the first surface and/or after forming the second surface. In particular, the placing of the spacer material between the first section and the second section may be performed prior to arranging the first surface and the second surface to form the overlap region, and/or prior to releasing the first high-temperature superconductor material or the second high-temperature superconductor material. The spacer material may be characterized by features corresponding to the features of the spacer material described in the context of the high-temperature superconducting qubit. The placing of the spacer material may use process steps as described in the context of arranging the first surface and the second surface to form the overlap region.

The method may further comprise chemically passivating the first section of the first surface and/or the second section of the second surface using the spacer material. According to such embodiments, the cooling the temperature of the first surface and/or the temperature of the second surface may be performed until the placing of the spacer material on the first section of the first surface and/or the second section of the second surface is completed. Alternatively or in addition, according to such embodiments, the controlling the partial pressure of water of the atmosphere adjacent to the first surface and/or the second surface may be performed until the placing of the spacer material on the first section of the first surface and/or the second section of the second surface is completed.

According to embodiments, forming the first surface comprises cleaving the first superconductor, and/or forming the second surface comprises cleaving the second superconductor. In particular, cleaving the first superconductor and/or cleaving the second superconductor may comprise using an elastomer.

Cleaving may produce a first (second) thesis surface corresponding to a bulk material prior to the cleaving, and/or to a bulk material which corresponds to the first (second) superconductor, with the advantages laid out above in the context of the bulk material corresponding to the first (second) superconductor.

Cleaving the first superconductor and/or cleaving the second superconductor may comprise mechanically exfoliating a portion of the first superconductor and/or the second superconductor, in particular mechanically exfoliating a portion of the first high-temperature superconductor material and/or mechanically exfoliating a portion of the first high-temperature superconductor material. The mechanically exfoliating may be performed using process steps as described in the context of the arranging of the first surface and the second surface to form the overlap region, in particular in the context of the lateral positioning of the first high-temperature superconductor material and/or the second high-temperature superconductor material.

Cleaving the first superconductor and/or cleaving the second superconductor, in particular mechanically exfoliating a portion of the first superconductor and/or the second superconductor, may comprise applying a pick-and-place technique, for example a pick and place technique as described in the context of arranging the first surface and the second surface to form the overlap region.

In particular, cleaving the first superconductor and/or cleaving the second superconductor, in particular mechanically exfoliating a portion of the first superconductor and/or the second superconductor, may comprise holding the first high-temperature superconductor material and/or the second high-temperature superconductor material, in particular as described in the context of arranging the first surface and the second surface to form the overlap region, in particular using the adhesive.

Cleaving the first superconductor may comprise controlling a thickness of the first high-temperature superconductor with the first surface. For example, controlling the thickness of the first high-temperature with the first surface may comprise measuring an experimentally evaluated thickness of the first high-temperature with the first surface. In particular, the measuring the experimentally evaluated thickness may comprise applying an optical technique. Controlling the thickness of the first high-temperature superconductor with the first surface may comprise selecting a first high-temperature superconductor with an experimentally evaluated thickness corresponding to a predefined thickness. The predefined thickness may correspond to the thickness of the first superconductor in the overlap region as described in the context of the high-temperature superconducting qubit.

Cleaving the second superconductor may comprise controlling a thickness of the second high-temperature superconductor with the second surface. Process steps corresponding to the ones described in the context of controlling the thickness of the first high-temperature superconductor with the first surface may be applied in the controlling of the thickness of the second high-temperature superconductor with the second surface.

The method may further comprise cleaving the spacer material, in particular cleaving the spacer material to control a thickness of the spacer material. Process steps corresponding the ones described in the context of the cleaving the first superconductor may be applied in cleaving the spacer material.

The method may be characterized by features corresponding to some or all of the features described in the context of the high-temperature superconducting qubit according to the first aspect.

DETAILED DESCRIPTION OF EMBODIMENTS

The following disclosure provides exemplary and non-limiting designs allowing for a high-temperature superconductor qubit. Consequently, the present disclosure may improve a critical temperature, a critical current, a critical magnetic field, a quality factor, and/or a sensitive to an external field, in particular to an external magnetic field.

Figure 1A:
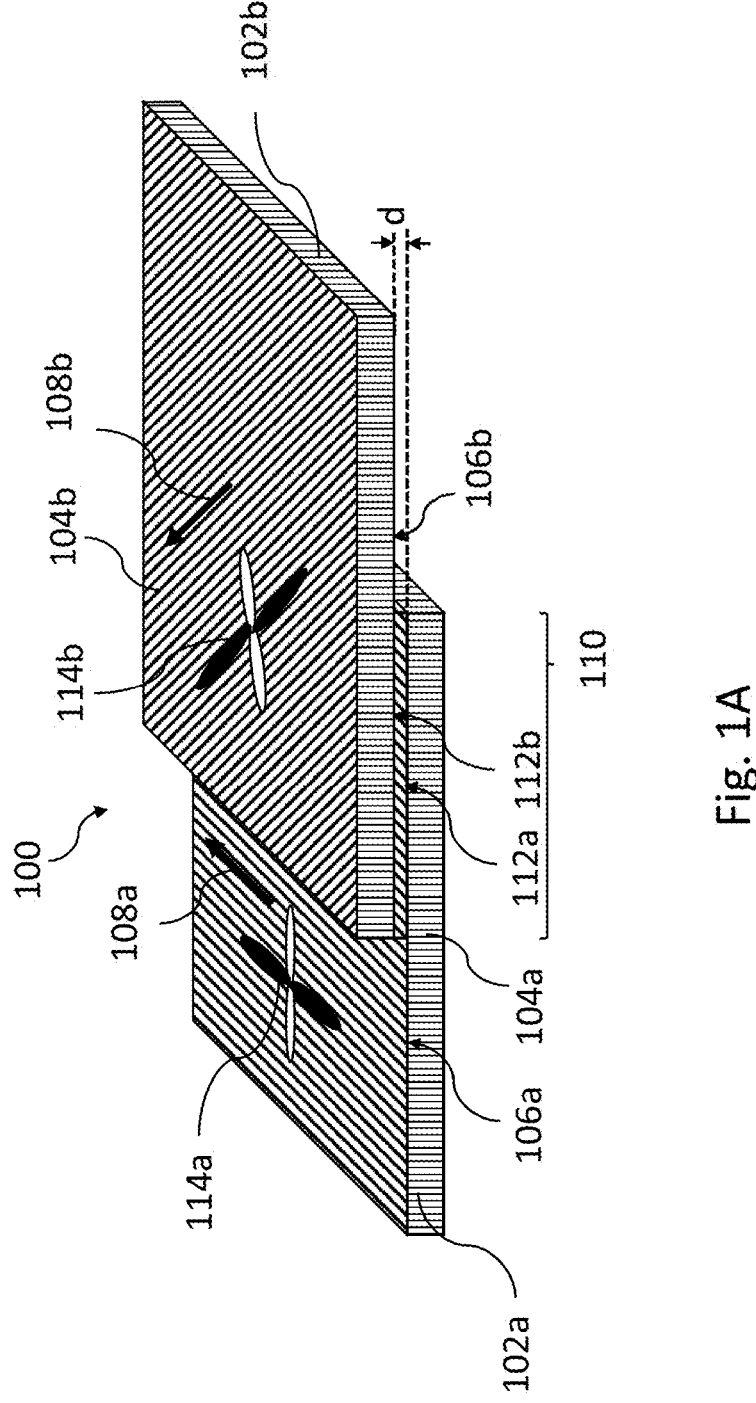
FIG. 1A shows a perspective view of a Josephson junction for a high-temperature superconducting qubit according to an embodiment.

FIG. 1A shows a perspective view of a first embodiment of a Josephson junction 100 which may provide the quantum mechanical two-level system of the high-temperature superconducting qubit. The Josephson junction 100 comprises a first superconductor 102a and a second superconductor 102b. The first superconductor 102a and the second superconductor 102b overlap in a region 110 forming an overlap region 110. In particular, in the overlap region 110 a first section 112a of a first surface 106a of the first superconductor 102a faces a second section 112b of a second surface 106b of the second superconductor 102b.

More precisely, the first surface 106a is a surface of a first high-temperature superconductor material 104a comprised in the first superconductor 102a. The first high-temperature superconductor material 104a will in the following be illustrated using the example of a first crystalline high-temperature superconductor material 104a. In the context of this disclosure, a material may be considered crystalline if a spatial distribution of a component of the material is at least in part aperiodic, such as the spatial distribution of a dopant, for example an oxygen dopand of high-temperature super-conductor materials known in the state of the art.

The first high-temperature superconductor material 104a may be a single crystal of a high-temperature superconductor material, a crystalline grain of the high-temperature superconductor material, or a crystallite of the high-temperature superconductor material. The first superconductor 102a may be a single crystal and identical with the first crystalline high-temperature superconductor material 104a, or the first superconductor 102a may comprise a plurality of crystalline grains or crystallites, with the first crystalline high-temperature superconductor material 104a being one of them.

Correspondingly, the second surface 106b is a surface of a second crystalline high-temperature superconductor material 104b comprised in the second superconductor 102b. In the overlap region 110, the first section 112a of the first surface 106a and the second section 112b of the second surface 106b are arranged in parallel to each other at a distance d. The space between them may be a void, or it may be at least partially filled by a spacer material, as will be described in more detail in the context of the embodiment of FIG. 1B below. According to embodiments of the invention, the distance d is adjusted in the fabrication of the Josephson junction 100, as will be described in detail in later in the context of the fabrication method.

According to embodiments, the distance d is adjusted such that an electrical contact between the first crystalline high-temperature superconductor material 104a and the second crystalline high-temperature superconductor material 104b is a tunnel contact, in particular a tunnel contact for a superconducting current. The tunnel contact may be beneficial for establishing the Josephson junction 100. Therefore, the distance d should exceed a bond length of, for example, chemisorption or of a covalent bond. A van der Waals interaction, a van der Waals gap, or a van der Waals distance, respectively, between the first section 112a of the first surface 106a and the second section 112b of the second surface 106b may provide an appropriate distance d to establish the tunnel contact. The van der Waals distance may correspond to at least 0.2 nm, at least 0.25 nm, at least 0.3 nm, at least 0.35 nm, at least 0.4 nm, at least 0.45 nm, or at least 0.5 nm, depending on the material or materials comprised in the first and/or the second crystalline high-temperature superconductor materials 104a, 104b.

Figure 1B:
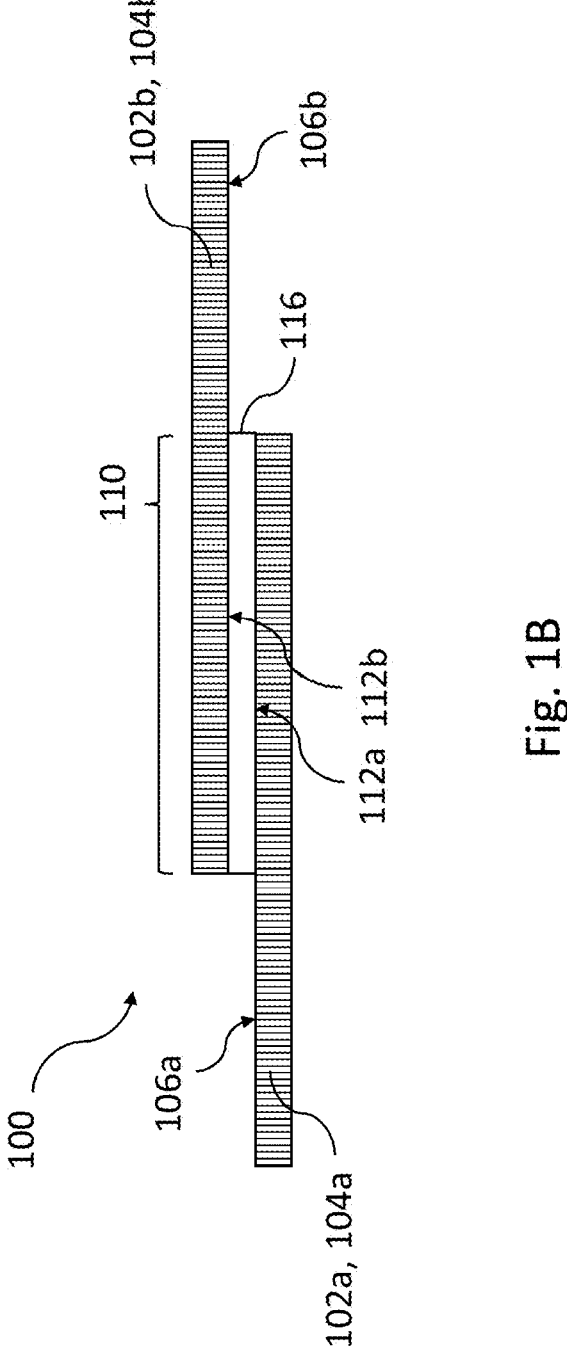
FIG. 1B shows a side view of a Josephson junction for a high-temperature superconducting qubit according to another embodiment.

FIG. 1B shows a side view of a Josephson junction 100 according to an embodiment. The embodiment is similar to the one of FIG. 1A. However, as compared to the embodiment of FIG. 1A, an even larger distance between the first section 112a of the first surface 106a and the second section 112b of the second surface 106b may be achieved with a spacer material 116 between the first section 112a of the first surface 106a and the second section 112b of the second surface 106b. The spacer material may also serve as a chemical passivation to the first section 112a of the first surface 106a and the second section 112b of the second surface 106b. Typically, the spacer material comprises a dielectric. However, a semiconductor, a metal, or even another superconductor may likewise be used, as long as the critical temperature of the other superconductor is below the operation temperature of the Josephson junction 100 and/or below a critical temperature of the Josephson junction 100.

A distance d allowing for the tunnel contact is typically at most 10 nm, in particular at most 8 nm, in particular at most 6 nm, in particular at most 4 nm, in particular at most 3 nm, in particular at most 2 nm, in particular at most 1 nm.

A sufficient area of the overlap region 110 may increase and therefore improve a total critical current of the Josephson junction 100. In this context, a total critical current may refer to an overall current that may flow between the first crystalline high-temperature superconductor material 104a and the second crystalline high-temperature superconductor material 104b while the Josephson junction 100 remains superconductive. In contrast, a critical current may refer to the total critical current per area of the overlap region 110. The Josephson junction 100 may provide an area of the overlap region 110 of at least 1 $\mu m^2$, in particular of at least 10 $\mu m^2$, in particular of at least 20 $\mu m^2$, in particular of at least 40 $\mu m^2$, in particular of at least 60 $\mu m^2$, in particular of at least 80 $\mu m^2$, in particular of at least 100 $\mu m^2$. The resulting increase and improvement of the total critical current improves the performance of the high-temperature superconducting qubit in applications such as metrology, qubits and quantum computing. Alternatively, a smaller area of the overlap region 110 may be implemented and may be beneficial for a reduced capacitance of the Josephson junction 100, which may be beneficial to specific applications.

The first crystalline high-temperature superconductor material 104a may refer to a material which behaves as a superconductor at a temperature higher than a maximum temperature of a low-temperature superconductor, such as aluminium or niobium, at which the low-temperature superconductor behaves superconducting. For example, the first crystalline high-temperature superconductor material may have a critical temperature of at least 4 K, in particular at least 8 K, in particular at least 15 K, in particular at least 30 K, in particular at least 50 K, in particular at least 70 K, in particular at least 78 K.

However, critical temperature or (maximum) temperature at which a material behaves as a superconductor, are neither the only nor always necessary criteria for defining the high-temperature superconductor material, in a particular the first crystalline high-temperature superconductor material 104a.

According to embodiments, the first crystalline high-temperature superconductor material 104a may refer to a type-II superconductor, and/or to d-wave superconductor, such as a superconductor with d-wave pairing and/or a superconductor comprising a transition metal ion, for example in a transition metal oxide or chalcogenide, and/or to a superconductor with a complex chemical composition, such as with at least two, three, four or five chemical elements, and/or with a complex crystallographic structure as opposed to, for example, a crystallographic structure of elemental superconductors such as aluminium or niobium. In particular, the first crystalline high-temperature superconductor material 104a may exhibit several or even all of the mentioned characteristics, as for example a superconducting ceramic, a superconducting transition metal oxide or chalcogenide, a cuprate superconductor, and/or a pnictide superconductor.

In particular, the first crystalline high-temperature superconductor material 104a may comprise a bismuth strontium calcium copper oxide with a chemical composition of the form $Bi_2Sr_2May_{-1}Cu_nO_{2n+4+x}$, wherein n=1, 2, 3, 4 and x is a positive number or a mixture thereof, hereafter referred to as BSCCO. Oxygen doping controls the value of x, which may be applied to adjust and/or maximize the critical current and/or the critical temperature of the BSCCO. The second crystalline high-temperature superconductor material 104b may comprise or be composed of a material from a selection corresponding to the one described for the first crystalline high-temperature superconductor material 104a. The first crystalline high-temperature superconductor material 104a and the second crystalline high-temperature superconductor material 104b may comprise or be composed of the same material or of different materials.

Open problems in the state of the art, such as limited superconducting junction properties, such as a limited critical temperature, a limited critical current, a limited critical magnetic field, and/or a limited quality factor of the Junction junction 100, may be related to the fact that properties of the Josephson junction 100 and/or the tunneling junction of the Josephson junction 100 are strongly influenced by the first crystalline high-temperature superconductor material 104a at the first surface 106a and the second crystalline high-temperature superconductor material 104b at the second surface 106b, in particular at the first section 112a of the first surface 106a and at the second section 112b of the second surface 106b. A major advantage of the Josephson junction 100 according to embodiments presented herein relates to an improved first and/or second crystalline high-temperature superconductor material 104a, 104b at the first and/or second surface 106a, 106b. The improved first and/or second crystalline high-temperature superconductor material 104a, 104b at the first and/or second surface 106a, 106b may be beneficial for the implementation of the Josephson junction 100. Moreover, the improved first and/or second crystalline high-temperature superconductor material 104a, 104b at the first and/or second surface 106a, 106b may be associated with the improved superconducting junction properties.

The strong influence of the first and second crystalline high-temperature superconductor materials 104a, 104b at the first and second surfaces 106a, 106b may be due to a short-range nature of an interaction between the first section 112a of the first surface 106a and the second section 112b of the second surface 106b, which underlies the current through the Josephson junction 100. According to embodiments, a current through the Josephson junction 100 may be a tunneling current and the Josephson junction 100 may be referred to as a tunneling junction. The current through the Josephson junction 100 is typically provided by charge carriers, for example by superconducting charge carriers and in some instances non-superconducting charge carriers, located in between the first section 112a of the first surface 106a and the second section 112b of the second surface 106b. Typically, the charge carriers of the first and/or second crystalline high-temperature superconductor materials 104a, 104b are localized mainly in the respective first and/or second crystalline high-temperature superconductor materials 104a, 104b, rather than in the space in between the corresponding surfaces. However, there may be a small localization of the charge carrier in the space in between the corresponding surfaces. The localization in the space in between the corresponding surfaces may be much larger for a charge carrier of the first and/or second crystalline high-temperature superconductor material 104a, 104b at the first and/or second surface 106a, 106b than for a charge carrier of first and/or second crystalline high-temperature superconductor material 104a, 104b which is not at the first and/or second surface 106a, 106b or further away from the first and/or second surface 106a, 106b. Therefore, the charge carrier of the first and/or second crystalline high-temperature superconductor material 104a, 104b at the first and/or second surface 106a, 106b may have a much stronger influence on the interaction between the first section 112a of the first surface 106a and the second section 112b of the second surface 106b than the charge carrier of first and/or second crystalline high-temperature superconductor material 104a, 104b which is not at the first and/or second surface 106a, 106b or further away from the first and/or second surface 106a, 106b. Consequently, the first and/or second crystalline high-temperature superconductor material 104a, 104b at the first and/or second surface 106a, 106b may have a much stronger influence on the interaction between the first section 112a of the first surface 106a and the second section 112b of the second surface 106b than first and/or second crystalline high-temperature superconductor material 104a, 104b which is not at the first and/or second surface 106a, 106b or further away from the first and/or second surface 106a, 106b. Consequently, the first and/or second crystalline high-temperature superconductor material 104a, 104b at the first and/or second surface 106a, 106b may have a much stronger influence on the Josephson junction 100 and/or the quantum mechanical two-level system associated with the Josephson junction 100 than first and/or second crystalline high-temperature superconductor material 104a, 104b which is not at the first and/or second surface 106a, 106b or further away from the first and/or second surface 106a, 106b.

Typically, a contribution of the charge carrier of first and/or second crystalline high-temperature superconductor material 104a, 104b which is not at the first and/or second surface 106a, 106b or further away from the first and/or second surface 106a, 106b decreases exponentially with an increasing distance from the first and/or second surface 106a, 106b, typically with a decay length on the order of approximately 0.1 nm. Therefore, the first and/or second crystalline high-temperature superconductor material 104a, 104b at the first and/or second surface 106a, 106b may refer to first and/or second crystalline high-temperature superconductor material 104a, 104b within a distance of 6 nm from the first surface, in particular within 3 nm from the first surface, in particular within 1.5 nm from the first surface, in particular within 1 nm from the first surface, in particular within 0.5 nm from the first surface, in particular within 0.3 nm from the first surface. The corresponding first and/or second crystalline high-temperature superconductor material 104a, 104b at the first and/or second surface 106a, 106b may have a strong influence on the Josephson junction 100 and/or the quantum mechanical two-level system associated with the Josephson junction 100.

Open problems in the state of the art, such as limited superconducting properties, a limited critical temperature, a limited critical current, a limited critical magnetic field, and/or a limited quality factor of high-temperature superconductor junctions, may be related to the fact that high-temperature superconductor material at surfaces of high-temperature superconductors may differ from bulk material of the high-temperature superconductor. In contrast, the improved first crystalline high-temperature superconductor material 104a at the first surface 106a according to embodiments disclosed herein may have the same properties as a bulk material corresponding to the first superconductor 102a and/or to the first crystalline high-temperature superconductor material 104a. The same properties may, for example, comprise an identical or essentially identical chemical composition. In particular, the essentially identical chemical composition may correspond to a similar or identical concentration of an element of the sixth main group of the periodic table of the elements, such as oxygen. These elements are particularly prone to chemical reactions, for example with water, such as during a fabrication of the Josephson junction 100. The chemical reactions may change, and, in particular, reduce a concentration of these elements in the first crystalline high-temperature superconductor material 104a at the first surface 106a. The concentration of these elements may be essential to the superconducting properties, for example, as they may be related to doping. For embodiments comprising BSCCO, the doping may be related to the parameter x, as has been laid out before in the context of the example of adjusting and/or maximizing the critical current and/or the critical temperature of the BSCCO. The identical or essentially identical chemical composition of the first crystalline high-temperature superconductor material 104a at the first surface 106a as a bulk material corresponding to the first superconductor 102a and/or to the first crystalline high-temperature superconductor material 104a may therefore improve the values and the reliability of the superconducting properties of the Josephson junction 100.

The same properties of the first crystalline high-temperature superconductor material 104a at the first surface 106a as a bulk material corresponding to the first superconductor 102a and/or to the first crystalline high-temperature superconductor material 104a may further comprise a same or identical crystal structure. As will be laid out in detail in the context of FIG. 1C, the crystal structure and/or an orientation of the first crystalline high-temperature superconductor material 104a, which for instance may be related to a lattice vector of the first crystalline high-temperature superconductor material 104a, may provide control over the Josephson junction 100 and/or quantum mechanical two-level system associated with the Josephson junction 100. The same or identical crystal structure of the first crystalline high-temperature superconductor material 104a at the first surface 106a as a bulk material corresponding to the first superconductor 102a and/or to the first crystalline high-temperature superconductor material 104a may improve the control, therefore improving the superconducting properties.

The improved first crystalline high-temperature superconductor material 104a at the first surface 106a may also be characterized by an atomically smooth first surface 106a, in particular by an atomically smooth first section 112a of the first surface 106a. For example, the first surface 106a and/or the first section 112a of the first section 106a may have a roughness of at most 0.3 nm, in particular at most 0.2 nm, in particular at most 0.1 nm, in particular at most 0.05 nm.

The improvement of the crystalline high-temperature superconductor material at the surface has been described with respect to the first crystalline high-temperature superconductor material 104a at the first surface 106a. The improvement of the crystalline high-temperature superconductor material at the surface may apply correspondingly to the second crystalline high-temperature superconductor material 104b at the second surface 106b.

Figure 1C:
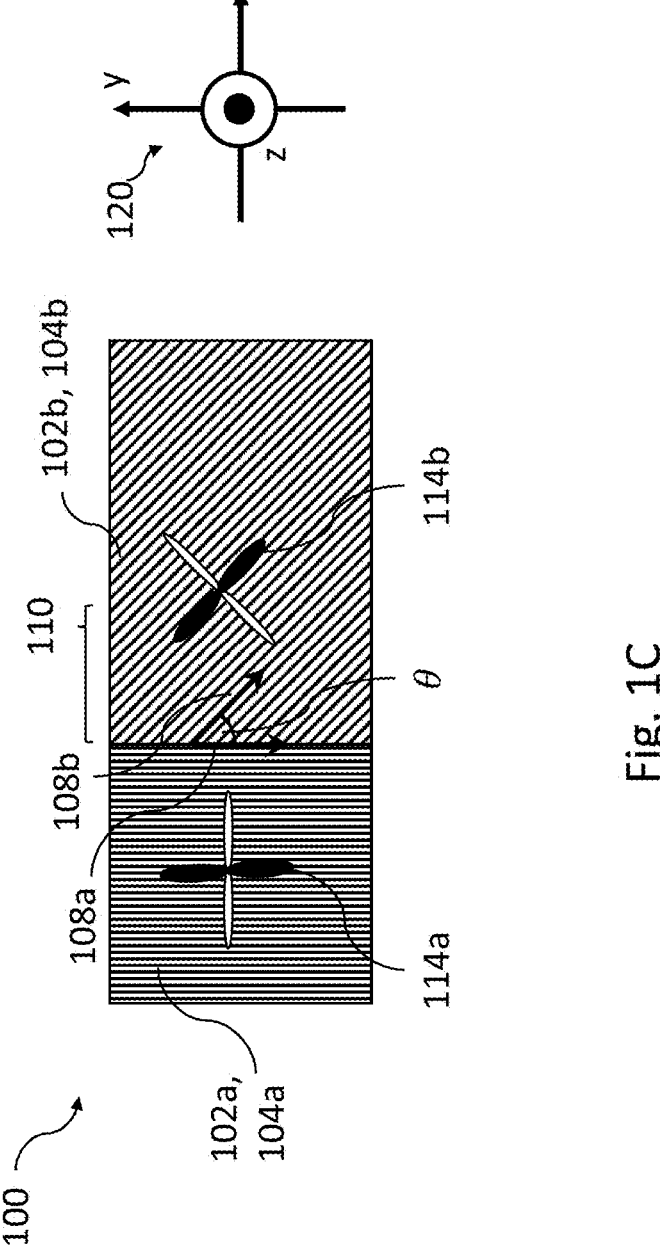
FIG. 1C shows a top view of a Josephson junction for a high-temperature superconducting qubit according to an embodiment which may be similar to the embodiment of FIG. 1A and/or to the embodiment of FIG. 1B.

Associated with its crystalline character, the first crystalline high-temperature superconductor material 104a further has a first orientation 108a as indicated in FIG. 1A. The first orientation 108a may be represented by an arrow or a line in a plane parallel to the first section 112a of the first surface 106a. FIG. 1C shows a top view of the Josephson junction 100, along a direction of a surface normal of the first surface 106a and perpendicular to the first orientation 108a. The first orientation 108a may for example correspond to a first primary lattice vector of the first crystalline high-temperature superconductor material 104a, such as an in-plane lattice primitive lattice vector of the first crystalline high-temperature superconductor material 104a, or a projection of a primitive lattice vector of the first crystalline high-temperature superconductor material 104a onto the first surface 106a. The first orientation 108a may alternatively or in addition correspond to a crystal facet of the first crystalline high-temperature superconductor material 104a, and/or to an edge of the first crystalline high-temperature superconductor material 104a. The first orientation 108a may alternatively or in addition correspond to a reciprocal lattice vector of the first crystalline high-temperature superconductor material 104a. Alternatively or in addition, the first orientation 108a may correspond to an electronic orbital 114a or to a crystal momentum of a Bloch state of the first crystalline high-temperature superconductor material 104a. In particular, the first crystalline high-temperature superconductor material 104a may be a d-wave superconductor, or a superconductor with a d-wave superconducting gap, respectively. In this case, the first orientation 108a may be associated with a d-wave electronic spectrum, in particular with a d-wave nodal electronic spectrum 114a.

The second crystalline high-temperature superconductor material 104b has a second orientation 108b as indicated in FIG. 1A and FIG. 1C, similar to the first orientation 108a of the first crystalline high-temperature superconductor material 104a. The second orientation 108b may be similar to the first orientation 108a, for example in a sense that both may correspond to a d-wave electronic spectrum, or to lattice vectors, wherein the lattice vector of the first crystalline high-temperature superconductor material 104a corresponds to the lattice vector of the second crystalline high-temperature superconductor material 104b. For example, if the first crystalline high-temperature superconductor material 104a and the second crystalline high-temperature superconductor material 104b both have layered crystal structures, the orientations 108a, 108b may each correspond to in-plane primitive lattice vectors of the respective layered crystal structures. If the first crystalline high-temperature superconductor material 104a and the second crystalline high-temperature superconductor material 104b are both d-wave superconductors, the orientations 108a, 108b may each correspond to respective d-wave nodal electronic spectra 114a, 114b.

The first orientation 108a and the second orientation 108b are arranged at an angle θ, or an intermediate angle respectively, see FIG. 1C. The angle θ is arranged corresponding to a predefined angle. This may improve the superconducting junction properties and corresponding superconducting qubit properties. In particular and as is illustrated also in FIG. 3A, FIG. 3B, FIG. 3C, the predefined angle may optimize at least one of the superconducting properties, such as the critical temperature or the critical current, possibly at the cost of a lower value of at least one of the other superconducting properties. To achieve this, a predefined angle in a range with a width of ±3°, ±2° or ±1° around a central predefined angle is typically advantageous. Consequently, an accuracy in defining the angle θ in a fabrication process of the Josephson junction 100 should at most be the width of the range. An accuracy of ±1° may be achieved with the method for fabricating the Josephson junction 100 according to the present disclosure.

Advantageously, the predefined angle may be selected, and the angle θ between the first orientation 108a and/or the second orientation 108b may correspondingly be adjusted for a reduced dissipation of the Josephson junction 100 and a qubit comprising the Josephson junction 100. The reduced dissipation may be related to the fact that in a crystalline material, such as the first crystalline high-temperature super-conductor material 104a or the second crystalline high-temperature superconductor material 104b, charge carriers may only propagate (or move, or travel, respectively) along specific propagation directions determined by the crystalline material. Consequently, an electric current associated with the charge carrier may only flow along these specific propagation directions. When the first crystalline high-temperature superconductor material 104a at the first surface 106a and the second crystalline high-temperature superconductor material 104b at the second surface 106b each are a crystalline material, the charge carrier may not change its direction of propagation (or movement, or travel, respectively) when it crosses the Josephson junction 100 and/or the tunneling junction, wherein the process of a carrier crossing the Josephson junction 100 and/or the tunneling junction provides a tunneling current. In particular, a component of the direction of propagation of the charge carrier parallel to the first section 112a of the first surface 106a and/or the second section 112b of the second surface 106b may not change. When the angle θ between the first orientation 108a and the second orientation 108b is arranged such that a propagation direction of the first crystalline high-temperature superconductor material 104a, in particular its component parallel to the first and/or second section 112a, 112b, is different from a propagation direction of the second crystalline high-temperature superconductor material 104b, in particular its component parallel to the first and/or second section 112a, 112b, a charge carrier in the first or the second crystalline high-temperature superconductor material 104a, 104b may not cross the Josephson junction 100 and/or the tunneling junction to reach the other, second or first crystalline high-temperature superconductor material 104b, 104a. Therefore, the electric current supported by the charge carrier, or the tunneling current, respectively, is reduced. In other words, a corresponding Josephson junction 100 may comprise a current filter. This may be achieved with a suitable predefined angle. For example, for an embodiment with a first crystalline high-temperature superconductor material 104a composed of BSCCO and a second crystalline high-temperature superconductor material 104b composed of BSCCO, the suitable predefined angle is 45°, as is known from the state of the art. Suitable predefined angles for a different first and/or second crystalline high-temperature superconductor material 104a, 104b may be selected based on well-developed electronic-structure calculations, such as density functional theory calculations, or based on experimental data, such as experimental data from photoelectron spectroscopy experiments or scanning tunneling microscopy experiments. The current filter may suppress dissipation losses. This improves an efficiency of the Josephson junction 100 and a coherence time of a qubit comprising the Josephson junction 100.

As an example, in the first crystalline high-temperature superconductor material 104a a charge carrier may be able to propagate along an x direction according to a coordinate system 120 of FIG. 1C, respectively. The second crystalline high-temperature superconductor material 104b is oriented such that the first orientation 108a and the second orientation 108b have an angle θ. In an embodiment wherein the first crystalline high-temperature superconductor material 104a is composed of BSCCO and the second crystalline high-temperature superconductor material 104b is composed of BSCCO, the angle θ may be 45° as indicated in FIG. 1C. Consequently, in the second crystalline high-temperature superconductor material 104b the charge carrier may be able to propagate along a diagonal direction between the x direction and a y direction according to the coordinate system 120 of FIG. 1C. As, according to the embodiment, the first high-temperature superconductor material 104a at the first surface 106a and the second crystalline high-temperature superconductor material 104b at the second surface 106b each are crystalline materials, the carrier may not change its direction of propagation within a plane spanned by the x direction and the y direction when it crosses the Josephson junction 100. The carrier may therefore not transfer between the first high-temperature superconductor material 104a and/or the second high-temperature superconductor material 104b. The carrier may therefore not contribute to a current of the Josephson junction 100 and/or to a tunneling current. In other words, the carrier is filtered, and a current filter is established. Consequently, a dissipation which might otherwise be associated with the propagation of the charge carrier and/or its tunneling current is suppressed. A reduced dissipation of the Josephson junction 100 is achieved, in particular with respect to an otherwise similar embodiment wherein the angle θ=0, and the charge carrier may cross the Josephson junction 100. The reduced dissipation may improve a coherence time of the high-temperature superconducting qubit.

For the direction of propagation to be conserved and a current filter to be established, a high crystalline quality of the first and/or second crystalline high-temperature superconductor material 104a, 104b at the first and/or second surface 106a, 106b is beneficial. As laid out before, the first and/or second crystalline high-temperature superconductor material 104a, 104b at the first and/or second surface 106a, 106b has a much stronger influence on the Josephson junction 100 and/or the tunneling junction of the Josephson junction 100 than first and/or second crystalline high-temperature superconductor material 104a, 104b which is not at the first and/or second surface 106a, 106b or further away from the first and/or second surface 106a, 106b. If part of or all of the first and/or second crystalline high-temperature superconductor material 104a, 104b at the first and/or second surface 106a, 106b is amorphous, the direction of propagation at the Josephson junction and/or the tunneling junction may not be conserved, and/or the current filter may not be established, and/or the reduced dissipation may not be achieved.

In embodiments wherein the first and/or second crystalline high-temperature superconductor material 104a, 104b has a layered crystal structure, a direction of an out-of-plane primitive lattice vector with respect to the layers of the layered crystal structure of the first and/or second crystalline high-temperature superconductor material 104a, 104b may be referred to as a c-axis, in particular of an out-of-plane primitive lattice vector with respect to the layers of the layered crystal structure. Alternatively, the c-axis may refer to a distinct direction of a non-isotropic, for example, non-cubic, lattice of the first and/or second crystalline high-temperature superconductor material 104a, 104b. In embodiments with a c-axis, the surface normal of the first section 112a and/or the second section 112b may typically correspond to the c-axis. Moreover, the propagation direction may be in a layer of the layered crystal structure. Alternatively or in addition, the propagation direction may be perpendicular to the c-axis. In such embodiments, the current of the Josephson junction 100 and/or the tunnel current may typically flow along the c-axis and be referred to as a c-axis current and/or as a c-axis tunneling current. In such embodiments, the predefined angle may be selected for a reduced dissipation associated with the c-axis current and/or the c-axis tunneling current.

The c-axis tunneling may, for example, occur in an embodiment wherein the first crystalline high-temperature superconductor material 104a is composed of BSCCO and the second crystalline high-temperature superconductor material 104b is composed of BSCCO. The first in-plane lattice vector of BSCCO and the second in-plane lattice vector of BSCCO span an angle of 90°. The propagation directions associated with BSCCO are along the layers of the layered crystal structure of BSCCO and associated with first and second in-plane lattice vectors of BSCCO. Consequently, in such an embodiment the propagation directions occur periodically every 90°. The first orientation 108a may correspond to the propagation direction of the first crystalline high-temperature superconductor material 104a and the second orientation 108b may correspond to the propagation direction of the second crystalline high-temperature superconductor material 104b. The predefined angle and/or the angle θ of 45° between the first orientation 108a and the second orientation 108b in such an embodiment may correspond to a maximum misalignment of the propagation directions of the first crystalline high-temperature superconductor material 104a and the second crystalline high-temperature superconductor material 104b. The maximum misalignment may improve the reduced dissipation. Accordingly, propagation directions and/or predefined angles may be identified for first and/or second crystalline high-temperature superconductor materials 104a other than BSCCO according to a Bravais lattice, a crystal system and/or a crystal structure of the first and/or second crystalline high-temperature superconductor materials 104a. In particular, a predefined angle may be identified for maximum misalignment of the propagation directions of the first crystalline high-temperature superconductor material 104a and the second crystalline high-temperature superconductor material 104b. For example, if the first and second crystalline high-temperature superconductor materials 104a, 104b comprise crystalline materials with the same Bravais lattice, crystal system and/or crystal structure, the predefined angle for the maximum misalignment of the propagation directions may correspond to half of an angle (+/−10%, in particular +/−5%) between a first lattice vector and a second lattice vector of the same Bravais lattice, crystal system and/or crystal structure.

Figure 2A:
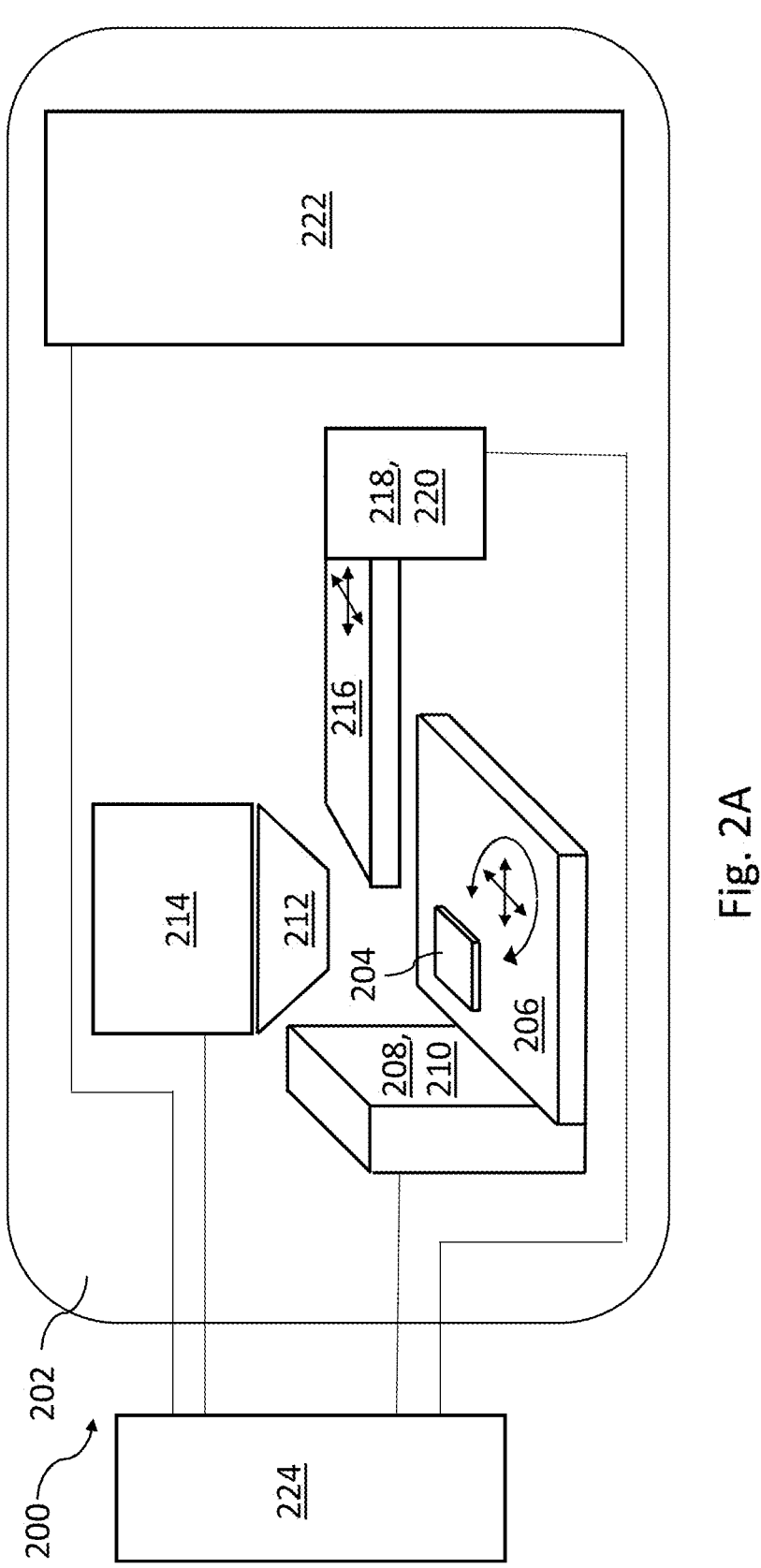
FIG. 2A shows an apparatus for fabricating a qubit element for a high-temperature superconducting qubit according to an embodiment.
Figure 2B:
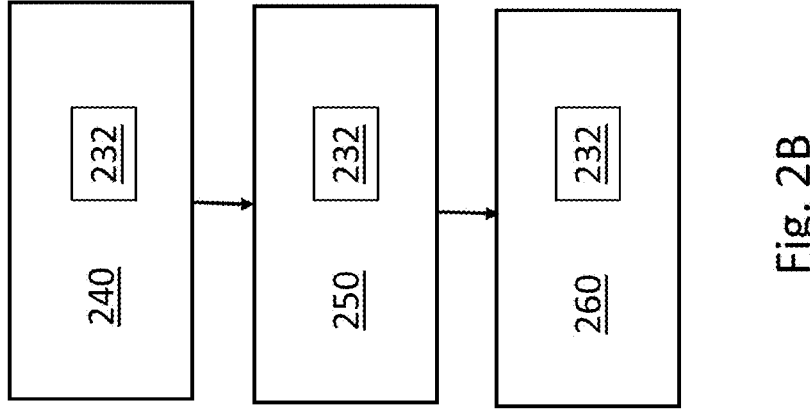
FIG. 2B shows a flow diagram of a method for fabricating a qubit element for a high-temperature superconducting qubit according to an embodiment.
Figure 2B:

FIG. 2A shows an apparatus 200 according to an embodiment for fabricating a qubit element for a high-temperature superconducting qubit comprising the Josephson 100, and FIG. 2B shows a flow diagram of a corresponding method 230 according to an embodiment.

As illustrated in FIG. 2A, the apparatus 200 for fabricating the Josephson junction 100 comprises a containment 202 providing a controlled atmosphere. This may typically be an inert gas atmosphere, such as in an inert gas atmosphere comprising nitrogen, argon, or another inert and/or noble gas. However, a controlled atmosphere could also comprise a vacuum. According to an embodiment, the containment 202 is a glove box 202. Within the containment 202, a superconductor material 204, which may comprise the first crystalline high-temperature superconductor material 104a and/or the second crystalline high-temperature superconductor material 104b, is arranged on a stage 206, which may provide translational and rotational degrees of freedom, in particular to the superconductor material 204. To this end, at least one motor 208 is coupled to the stage. In addition, a temperature control system 210 is coupled to the superconductor material 204 and/or to the stage 206. In particular, the temperature control system 210 may comprise a cooling system for providing a sample temperature of the superconductor material 204, which may be cryogenic and/or below room temperature. The at least one motor 208 and the temperature control system 210 are shown as one integrated system 208, 210 in FIG. 2A, but they may also be implemented as two separate systems. An optical technique to identify a position of the superconductor material 204 is provided by a microscope 212. A camera 214 is connected to the microscope 212. The apparatus 200 further comprises a manipulator 216 with at least one manipulator motor 218, which may be similar to the at least one motor, and a manipulator temperature control system 220, which may be similar to the temperature control system. The camera is connected to an electronic control system 224, which may be located outside of the containment 202. The electronic control system 224 may comprise one or more computer components, such as a processor or a memory. The electronic control system 224 is adapted to obtain and optionally to record images associated with the optical technique, for example from the camera 214. The electronic control system 224 is further adapted to obtain and/or record a position of the at least one motor 208 and/or to set a set point position of at least one motor 208. The electronic control system 224 is further adapted to obtain and/or record a manipulator position of the at least one manipulator motor 218 and/or to set a set point manipulator position of at least one manipulator motor 218. In addition, the electronic control system 224 is adapted to obtain a temperature from the temperature control system 210 and/or to set a set point temperature of the temperature control system 210. In addition, the electronic control system 224 is adapted to obtain a manipulator temperature from the manipulator temperature control system 220 and/or to set a manipulator set point temperature of the manipulator temperature control system 220. In particular, the electronic control system may be adapted to automatically adjust the set point position of the at least one motor 208, the set point temperature of the temperature control system 210, the set point manipulator motor position of the at least one manipulator motor 218, the manipulator set point temperature of the manipulator temperature control system 220, in particular in response to the image obtained from the camera 214, to the position of the at least one motor 208, to the manipulator temperature of the manipulator temperature control system 220, to the manipulator position of the at least one manipulator motor 218, and/or to the manipulator temperature from the manipulator temperature control system 220, respectively. The apparatus 200 further comprises an evaporator system 222, for example for depositing conductive and/or metallic materials such as gold. A transfer between the stage 206 and the evaporator system 222 may be robotic and/or automatized. According to FIG. 2A, the at least one motor 208, the temperature control system 210, the microscope 212, the camera 214, the at least one manipulator motor 218, and the manipulator temperature control system 220 are arranged inside the containment 202. However, any of these components may be arranged at least in part outside of the containment and be coupled to its corresponding counterpart inside of the containment 202 by means known from the state-of-the-art. Moreover, the evaporator system 222 may be arranged in the same containment 202 as the stage 206, or it may be arranged in a separate containment, with means for a transfer between the containment 202 and the separate containment via a controlled atmosphere.

FIG. 2B illustrates a method 230 for fabricating the Josephson junction 100. The method comprises forming 240 the first surface 106a of the first crystalline high-temperature superconductor material 104a, forming 250 the second surface 106*b* of the second crystalline high-temperature superconductor material 104*b*, and arranging 260 the first surface 106*a* and the second surface 106*b* to form the overlap region 110.

Any or all of the process steps 240, 250, 260 may comprise cooling 232 a temperature of the first surface 106*a* and/or a temperature of the second surface 106*b* to a cryogenic temperature, such as a temperature below an environmental temperature, or a temperature below, for example, 250 K, below 230 K, in particular to below 210 K, in particular to below 190 K, in particular to below 170 K, in particular to below 150 K.

Typically, the first surface 106*a* is formed by cleaving a superconductor material 204 which comprises crystalline material, such as a first crystalline high-temperature superconductor material 104*a*. The cleaving is typically performed moving the stage 206 and/or the manipulator 216. For example, if the superconductor material 204 has a layered crystal structure, an adhesive may fix the superconductor material 204 to the stage, and an adhesive may form a joint between the superconductor material 204 and the manipulator 216. The joint may be formed and released by controlling the manipulator temperature to a temperature below and above a melting temperature of the adhesive. In particular, joint may be released when the manipulator temperature is above the melting temperature of the adhesive and the adhesive is molten. The joint may be fixed when the manipulator temperature is decreased to a temperature below the melting temperature of the adhesive while the molten adhesive is in contact with the superconductor material 204 and the manipulator 216.

According to an embodiment, moving the stage 206 and/or the manipulator 216 while the joint is fixed may be used for separating the superconductor material 204 into a first superconductor 100*a* and a second superconductor 100*b*. If the superconductor material 204 has a layered crystal structure, the separating may occur between two layers of the lead crystal structure, exposing the first surface 106*a* and the second surface 106*b* with respective orientations 108*a*, 108*b*, which are typically aligned in the moment of cleaving. Cleaving procedures have been developed for numerous materials not limited to materials with layered crystal structure, for example for superconductors, high-temperature superconductors, such as BSCCO, oxides, and/or chalcogenides, and various known cleaving procedures may be applied using the stage 206 and the manipulator 216. When only one cleaving step is applied, such as in the embodiment described above, the first surface 106*a* and the second surface 106*b* are generated simultaneously. However, the first surface 106*a* and the second surface 106*b* may be generated consecutively, for example by applying a first cleaving step to generate the first surface 106*a* and a second cleaving step to generate the second surface 106*b*. The second cleaving step may be applied to a second superconductor material different from the superconductor material 204. Consequently, the first surface 106*a* and the second surface 106*b* may have different chemical compositions and/or different crystal structures and/or different orientations right after the cleaving.

Moreover, a thickness of the first superconductor 102*a* and/or the first crystalline high-temperature superconductor material 104*a* after the cleaving step may be controlled by selecting a first superconductor 102*a* and/or a first crystalline high-temperature superconductor material 104*a* generated in the cleaving step of a predefined thickness. For example, the thickness of the first superconductor 102*a* and/or the first crystalline high-temperature superconductor material 104*a* may be identified using the optical technique, for example according to an optical absorption or an optical extinction associated with the first superconductor 102*a* and/or the first crystalline high-temperature superconductor material 104*a*, and/or according to an optical interference property of the first superconductor 102*a* and/or the first crystalline high-temperature superconductor material 104*a*, such as an apparent color related to optical interference effects. In particular, the thickness of the first superconductor 102*a* and/or the first crystalline high-temperature superconductor material 104*a* may be identified and/or controlled automatically using the microscope 212, the camera 214, and the electronic control system 224. A thickness of the second superconductor 102*b* and/or the second crystalline high-temperature superconductor material 104*b* may be controlled in a similar way.

After forming the first and/or second surface 106*a*, 106*b*, the first and/or second surface 106*a*, 106*b* is exposed to an atmosphere adjacent to the first and/or second surface 106*a*, 106*b*. This may sometimes cause problems associated with changes of the properties of the first and/or second surface 106*a*, 106*b* which is exposed. In particular, a temperature of the first and/or the second surface 106*a*, 106*b* approaching room temperature, for example exceeding 250 K, may deteriorate the superconducting properties of the Josephson junction 100 produced in the method 230. Advantageously, the method according to the present disclosure may comprise control over the changes by cooling the temperature of the first and/or the second surface 106*a*, 106*b* which is exposed. The cooling minimizes the changes of the exposed first and/or second surface 106*a*, 106*b*.

The fabrication process may further be improved by providing a control over the atmosphere adjacent to the first and/or the second surface 106*a*, 106*b*, i.e. the atmosphere inside the containment 202. A partial pressure of water in the atmosphere adjacent to the exposed surface exceeding 0.01 Pa may deteriorate the superconducting properties of the Josephson junction 100 produced in the method 230. Moreover, a presence of organic solvents in the atmosphere may deteriorate the superconducting properties of the Josephson junction 100 produced in the method 230.

For implementing the Josephson junction 100 between the first crystalline high-temperature superconductor material 104*a* and the second crystalline high-temperature superconductor material 104*b*, a sample temperature below 250 K, a partial pressure of water in the atmosphere adjacent to the exposed surface below 0.01 Pa, and an absence of organic solvents in the atmosphere adjacent to the exposed surface have proven beneficial.

For the same purpose, keeping a time interval, during which the first and/or second surface 106*a*, 106*b* is exposed short has proven beneficial, such as at most 15 minutes, in particular at most 10 minutes, in particular at most 8 minutes, in particular at most 4 minutes, in particular at most 3 minutes, in particular at most 2 minutes, in particular at most 1 minute.

Arranging 260 the first surface 106*a* and the second surface 106*b* to form the overlap region 110 may comprise arranging the orientations 108*a*, 108*b* of the first surface 106*a* and the second surface 106*b* to form an angle θ corresponding to the predefined angle. When the first surface 106*a* and the second surface 106*b* are formed from a single superconductor material 204 in a single cleaving process, this may be achieved by rotating the first surface 106*a* and/or the second surface 106*b*, such that the overall amount of the rotation corresponds to the predefined angle. For example, in embodiments where the first surface 106*a* is a surface of a portion of the superconductor material 204 remaining on the stage 206 after cleaving with the stage 206 and the manipulator 216, and the second surface 106b is a surface of the portion of the superconductor material 204 adhering to the manipulator 216 after the cleaving process, the angle may be arranged by rotating the stage 206 according to the predefined angle. When the first surface 106a and the second surface 106b are generated consecutively and/or in a first cleaving step and a second cleaving step, and or from the superconductor material 204 and from a second superconductor material different from the superconductor material 204, additional process steps may be applied to align the angle between the first orientation 108a and the second orientation 108b according to the predefined angle.

For example, the first orientation 108a may be determined in terms of a first lattice vector, in particular a first in-plane lattice vector, from a diffraction experiment, such as an x-ray diffraction experiment or an electron diffraction experiment. Accordingly, the second orientation 108b may be determined in terms of a second lattice vector, in particular a second in-plane lattice vector, from a diffraction experiment, such as an x-ray diffraction experiment or an electron diffraction experiment. The first orientation 108a and the second orientation 108b may be determined prior to the first cleaving step and/or the second cleaving step. The superconductor material 204 and the second superconductor material may be aligned according to the predefined angle prior to the first cleaving step and the second cleaving step, which may avoid rotating the first surface 106a and/or the second surface 106b after the first cleaving step and/or the second cleaving step, thus shortening the time interval during which the first and/or the second surface 106a, 106b is exposed. Alternatively, the superconductor material 204 and the second superconductor material may be formed from a common starting superconductor material prior to the first cleaving step and/or the second cleaving step. In this case, the angle between the first orientation 108a and the second orientation 108b may be defined by rotating the superconductor material 204a and the second superconductor material with respect to each other prior to forming the first surface 106a and/or forming the second surface 106b.

Arranging 260 the first surface 106a and the second surface 106b to form the overlap region 110 may further comprise arranging the first surface 106a and the second surface 106b at the distance d. This may be achieved by pressing the second surface 106b of the second crystalline high-temperature superconductor material 104b, which may adhere to the manipulator 216 after forming 250 the second surface 106b, onto the first surface 106a of the first crystalline high-temperature superconductor material 104a, which may be arranged on the stage 206. A pressure and/or a duration of pressing the second surface 106b onto the first surface 106a may be used to adjust the distance d between the first surface 106a and the second surface 106b. Prior to pressing the second surface 106b onto the first surface 106a, the positions of the first surface 106a and/or the second surface 106b with respect to each other may be adjusted by translating the stage 206 and/or the manipulator 216. In this way, the area of the overlap region 110 may be adjusted.

The evaporator system 222 may be applied to define electrical contacts to the first superconductor 102a and/or the second superconductor 102b. The contacts may be defined prior to forming the first surface 106a and/or the second surface 106b, for example on a substrate that the first superconductor 102a and/or the second superconductor 102b are later placed on, such as in the process step of arranging 230 the first surface 106a and the second surface 106b to form the overlap region 110. Alternatively, the contacts may be defined after arranging 230 the first surface 106a and the second surface 106b to form the overlap region 110. In the latter case, a mask, such as a stencil mask, may be arranged over the first superconductor 102a and/or the second superconductor 102b after arranging 230 the first surface 106b and the second surface 106b to form the overlap region 110. The mask may be placed using the manipulator 216 and the microscope 212. Thereafter, the Josephson junction 100 with the mask is transferred to the evaporator system 222, and a conductive and/or metallic material such as gold is deposited according to at least one opening of the mask. According to embodiments, part of the contacts are defined prior to forming 240, 250 the first surface 106a and/or the second surface 106b, and part of the contacts are defined after arranging 260 the first surface 106a and the second surface 106b to form the overlap region 110. In particular, contacts to the first superconductor 102a may be defined prior to forming 240, 250 the first surface 106a and/or the second surface 106b, and contacts to the second superconductor 102b may be defined after arranging 260 the first surface 106a and the second surface 106b to form the overlap region 110. In such embodiments, contacts to the first superconductor 102a may be below the first superconductor 102a, and contacts to the second superconductor 102b may be above the second superconductor 102b, for example with respect to a z axis corresponding to the z axis of FIG. 1C.

Figure 3A:
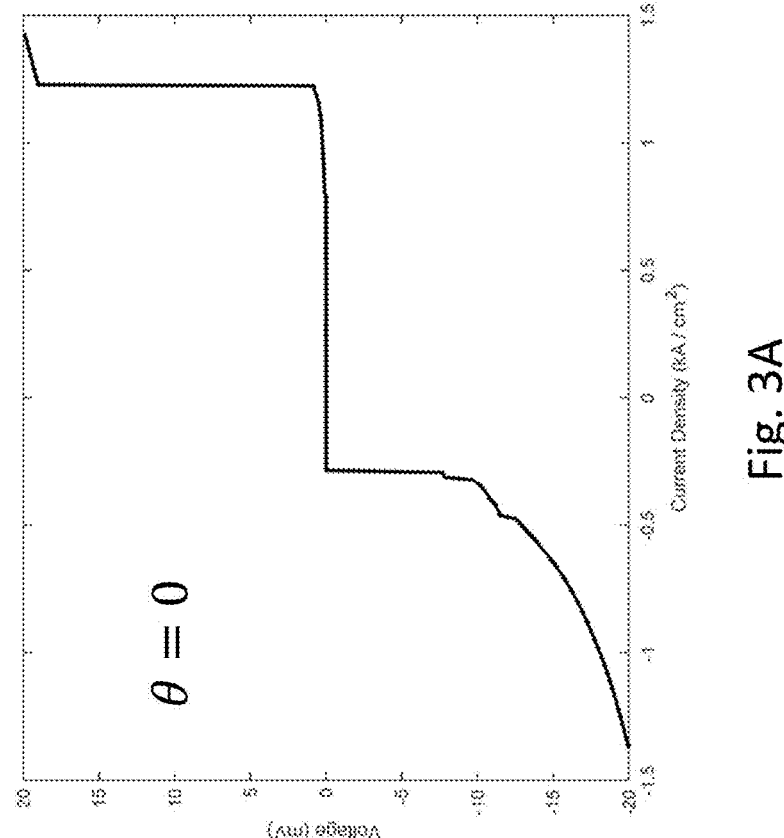
FIG. 3A shows a current-voltage characteristic of a Josephson junction according to an embodiment.
Figure 3B:
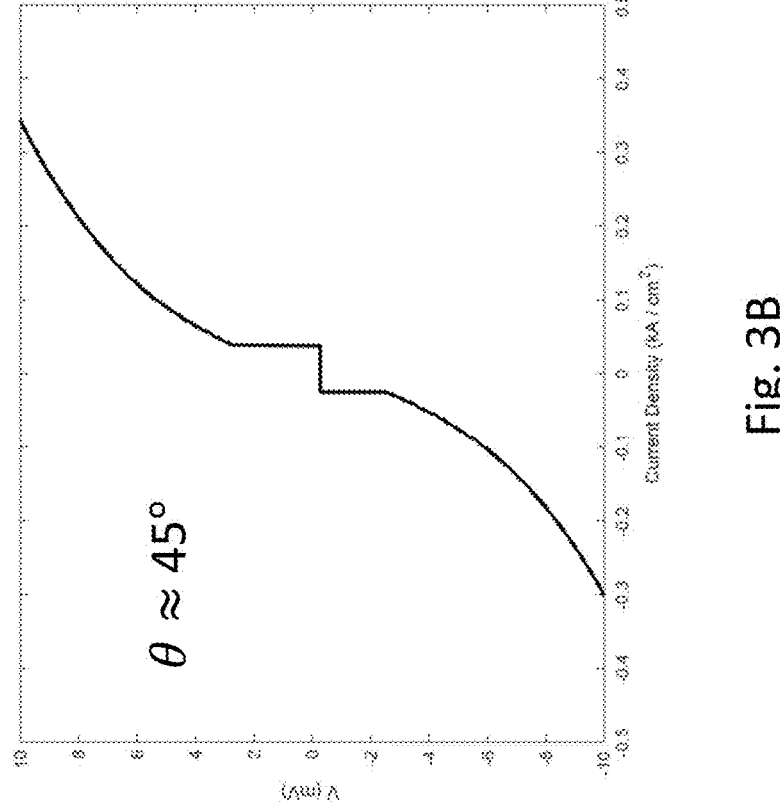
FIG. 3B shows a current-voltage characteristic of a Josephson junction for a high-temperature superconducting qubit according to another embodiment.
Figure 3C:
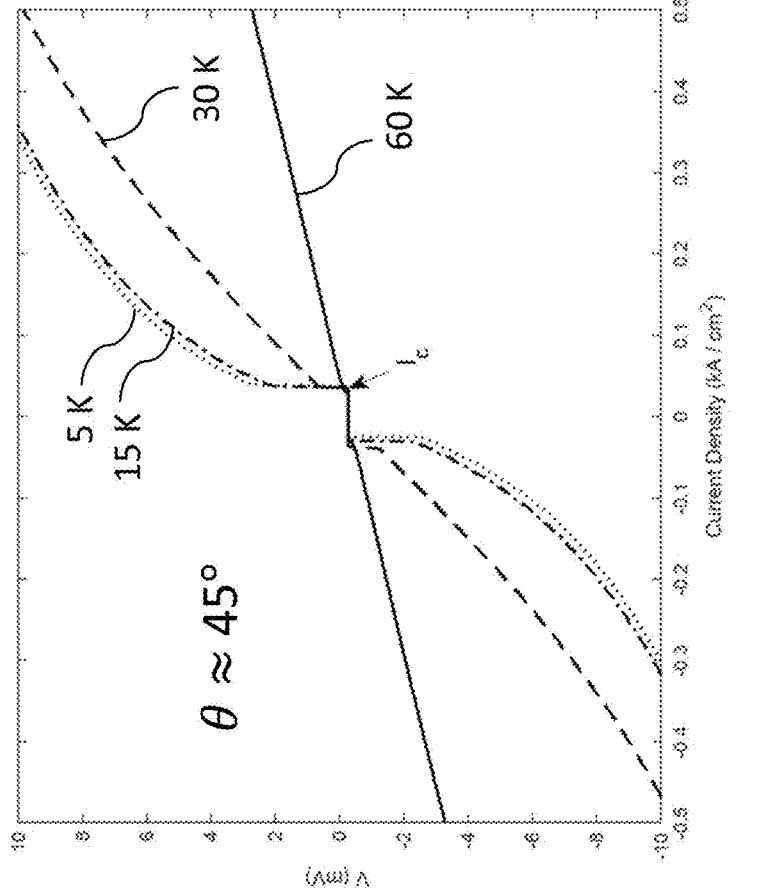
FIG. 3C shows the current-voltage characteristic of the Josephson junction for the high-temperature superconducting qubit according to the embodiment of FIG. 3B for different temperatures.

FIG. 3A shows a current-voltage characteristic of a Josephson junction 100 according to an embodiment. FIG. 3B shows a current-voltage characteristic of a Josephson junction 100 according to a similar embodiment. FIG. 3C shows current-voltage characteristics of the Josephson junction according to the embodiment of FIG. 3B, but for different temperatures of the Josephson junction.

According to the embodiments of FIG. 3A, FIG. 3B, and FIG. 3C, the first superconductor 102a and the second superconductor 102b are both single-crystalline BSSCO with n=0. BSSCO has a layered crystal structure, and the c-axes of the BSCCO are arranged perpendicularly to the first surface 106a and the second surface 106b. The first orientation 108a and the second orientation 108b are thus related to in-plane lattice vectors of the first crystalline high-temperature superconductor material 104a and the second crystalline high-temperature superconductor material 104b. BSCCO is a d-wave superconductor. The first orientation 108a and the second orientation 108b are thus also related to a first d-wave nodal electronic spectrum 114a and a second d-wave nodal electronic spectrum 114b. The embodiment of FIG. 3A differs in its angle $\theta=0$ from the embodiment of FIG. 3B and FIG. 3C with an angle $\theta=45°$.

The Josephson junction 100 according to the embodiment of FIG. 3A was fabricated by cleaving a single-crystalline BSSCO superconductor material 204, namely by attaching the manipulator 216 with an adhesive to the single-crystalline BSSCO superconductor material 204 on the stage 206 and lifting the manipulator 216 to generate the first surface 106a and the second surface 106b. Without rotating either of the first and/or the second surface 106a, 106b, the manipulator 216 was then moved downwards to press the second surface 106b onto the first surface 106a and to generate the overlap region 110. The distance corresponds to the van der Waals gap of BSCCO. During the entire procedure, the BSCCO material was kept at a cryogenic temperature, and an atmosphere in the glove box 202 was kept at a partial pressure of water below 0.01 Pa and free of organic solvents. Metallic contacts to the first superconductor 102a were realized as metallic leads on a substrate under the first superconductor 102*a*. Metallic contacts to the second superconductor 102*b* were deposited using the evaporator 222 after pressing the second surface 106*b* onto the first surface 106*a* to generate the overlap region 110. The critical current of the junction, which is the maximum current in FIG. 3A for which a voltage and hence the resistance of the Josephson junction 100 vanishes, is similar to the bulk critical current of BSCCO, which amounts to 1240 A/cm². In other words, the Josephson junction 100 according to the embodiment of FIG. 3A is similar to bulk BSCCO. This indicates that the first crystalline high-temperature superconductor material 104*a* at the first surface 106*a* is unaltered in the fabrication process and similar or identical to bulk BSCCO, i.e., to the bulk material corresponding to the first crystalline high-temperature superconductor material 104*a*. The same applies to the second crystalline high-temperature superconductor material 104*b* at the second surface 106*b*. This is also reflected in the critical temperature of the Josephson junction 100 according to the embodiment of FIG. 3A, which is similar to the critical temperature of bulk BSCCO, i.e., to the bulk material corresponding to the first crystalline high-temperature superconductor material 104*a*. In particular, Josephson junctions 100 according to this description may reliably provide a critical temperature of 85 K for embodiments in which the first and second superconductor 102*a*, 102*b* are formed from BSCCO with n=2. The critical temperature of bulk BSCCO with n=2 amounts to 96 K.

The Josephson junction 100 according to the present disclosure may hence overcome problems in the state-of-the-art, wherein critical temperatures of high-temperature superconductor junctions are significantly smaller than critical temperatures of bulk materials corresponding to the high-temperature superconductor junctions. In particular, smaller critical temperatures of Josephson junctions according to the state of the art may be associated with a reduced critical temperature of a high-temperature superconductor material at the surface forming the Josephson junction.

FIG. 3B shows the current-voltage characteristics of a Josephson junction according to an embodiment similar to the one of FIG. 3A. However, according to this embodiment, between lifting the manipulator 216 to generate the first surface 106*a* and the second surface 106*b* and moving the manipulator 216 downwards to press the second surface 106*b* onto the first surface 106*a*, the first surface 106*a* and/or the stage 206 it is located on, respectively, have been rotated by 45°. This adjusts the angle θ between the first orientation 108*a* and the second orientation 108*b* to a respective value of 45°. The Josephson junction 100 according to this embodiment shows a significantly lower critical current than the Josephson junction 100 according to the embodiment of FIG. 3A. Both embodiments have been fabricated applying the same temperatures and atmospheres in the fabrication process. Hence, in the embodiment according to FIG. 3B, just like in the embodiment according to FIG. 3A, the first and/or second crystalline high-temperature superconductor material 104*a*, 104*b* at the first and/or second surface 106*a*, 106*b* is unaltered in the fabrication process and similar or identical to bulk BSCCO. The significantly lower critical current of the Josephson junction 100 according to the embodiment of FIG. 3B is associated with the angle θ of 45° and the resulting current filter described above in the context of FIG. 1B and FIG. 1C. Hence, the dissipation of the Josephson junction 100 may be reduced. This is another improvement over the state-of-the-art, wherein critical currents of the high-temperature superconductor junctions do not depend on an angle θ, and consequently a current filter and/or a corresponding reduced dissipation has not been implemented.

FIG. 3C shows current-voltage characteristics of the Josephson junction 100 according to the embodiment of FIG. 3B for different temperatures of the Josephson junction 100. For each temperature, at the critical current $I_c$ a discontinuity occurs in the measured voltage. A voltage difference at the discontinuity depends on the temperature of the Josephson junction 100. In particular, the voltage difference shows an exponential dependence on the temperature of the Josephson junction 100. The exponential dependence is characteristic for a Josephson junction. The current voltage characteristics of FIG. 3C hence demonstrate that the Josephson junction 100 according to the disclosure comprises a Josephson junction between the first crystalline high-temperature superconductor material 104*a* and the second crystalline high-temperature superconductor material 104*b*. This is another improvement over the state-of-the-art, wherein a Josephson junction of a high-temperature superconductor junction has not been implemented.

Figures 4A, 4B:
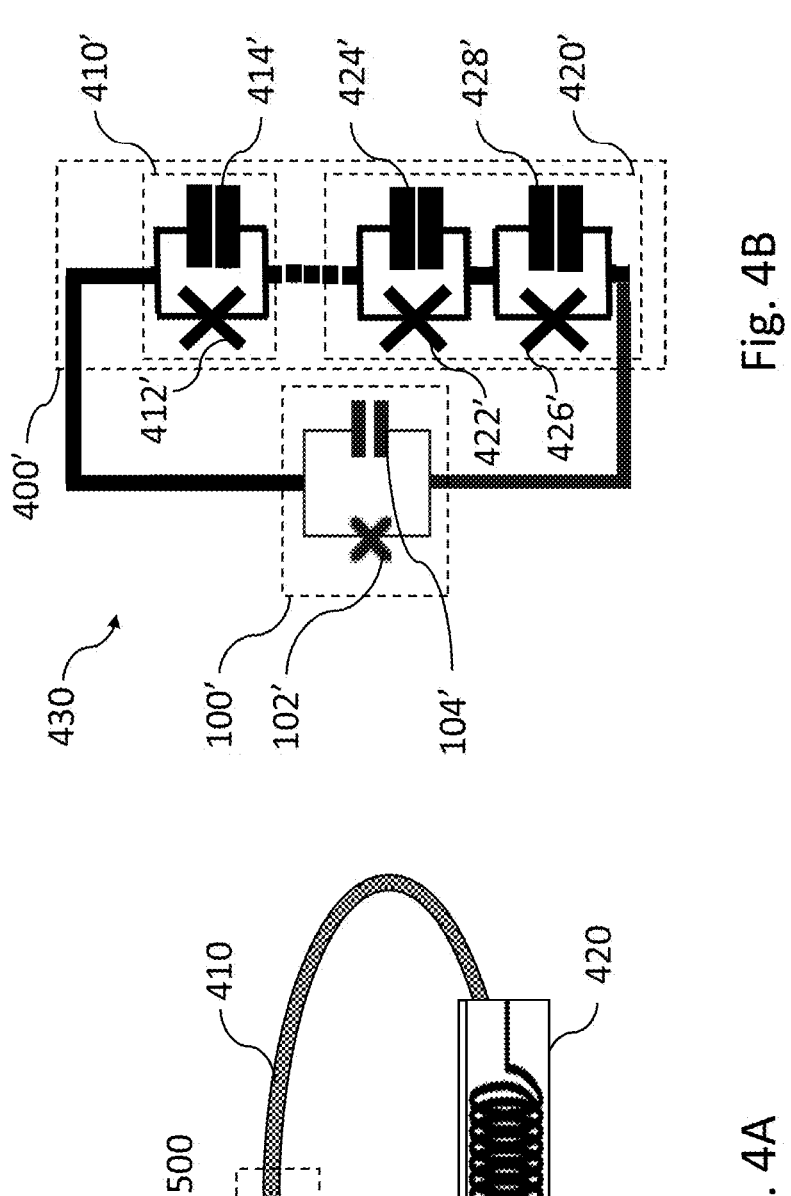
FIG. 4A shows a component of a high-temperature superconducting qubit.
FIG. 4B shows a circuit diagram corresponding to the component of the high-temperature superconducting qubit of FIG. 4A.

FIG. 4A a shows a component of a qubit system (qubit element) comprising the Josephson junction 100 according to the present disclosure, and FIG. 4B shows a corresponding circuit diagram 430. Similar elements have similar reference signs. In addition to the Josephson junction 100, the component of the qubit system comprises an inductance loop 400. The inductance loop 400 comprises a circular or elliptical ring 410 with a gap. Additional inductances 420 may be implemented as additional Josephson junctions. The circular or elliptical ring as well as the additional inductances may comprise superconductors, which may be low-temperature superconductors such as niobium or aluminium, or high-temperature superconductors.

The component of the qubit system may be formed by first fabricating the inductance loop 400 with the circular or elliptical ring with the gap 410 and the additional inductances 420. The inductance loop is formed using established techniques from the state-of-the-art. Subsequently, the Josephson junction 100 is placed in the gap of the circular or elliptical ring 410. The Josephson junction 100 may be coupled to the inductance loop capacitively. Alternatively, conductive contact elements may be formed between the conductance loop 400 and the Josephson junction 100, as will be laid out in more detail in the context of FIG. 5A and FIG. 5B, to ensure a reliable electrical connection with a low resistance.

In the corresponding circuit diagram 430 shown in FIG. 4B, the elements, such as the Josephson junction 100', and the inductance loop 400' with the circular or elliptical ring 410' with the gap and the additional inductances 420' are represented by inductances 102', 412', 422', and 426' and capacitances 104', 414', 424', and 428'. A qubit system denotes a quantum-mechanical two-level system suitable for quantum information processing. The circuit diagram of FIG. 4B provides a closed circuit comprising the Josephson junction 100. In the context of the Josephson junction 100 of the disclosure, the qubit may be implemented as an amplitude of a superconducting current through the Josephson junction 100, a phase of a superconducting current through the Josephson junction 100, or a combination of the amplitude and the phase. Alternative, the qubit may be implemented as an amplitude of a charge of the Josephson junction 100, a phase of the charge, or a combination of the amplitude and the phase.

Figure 5A:
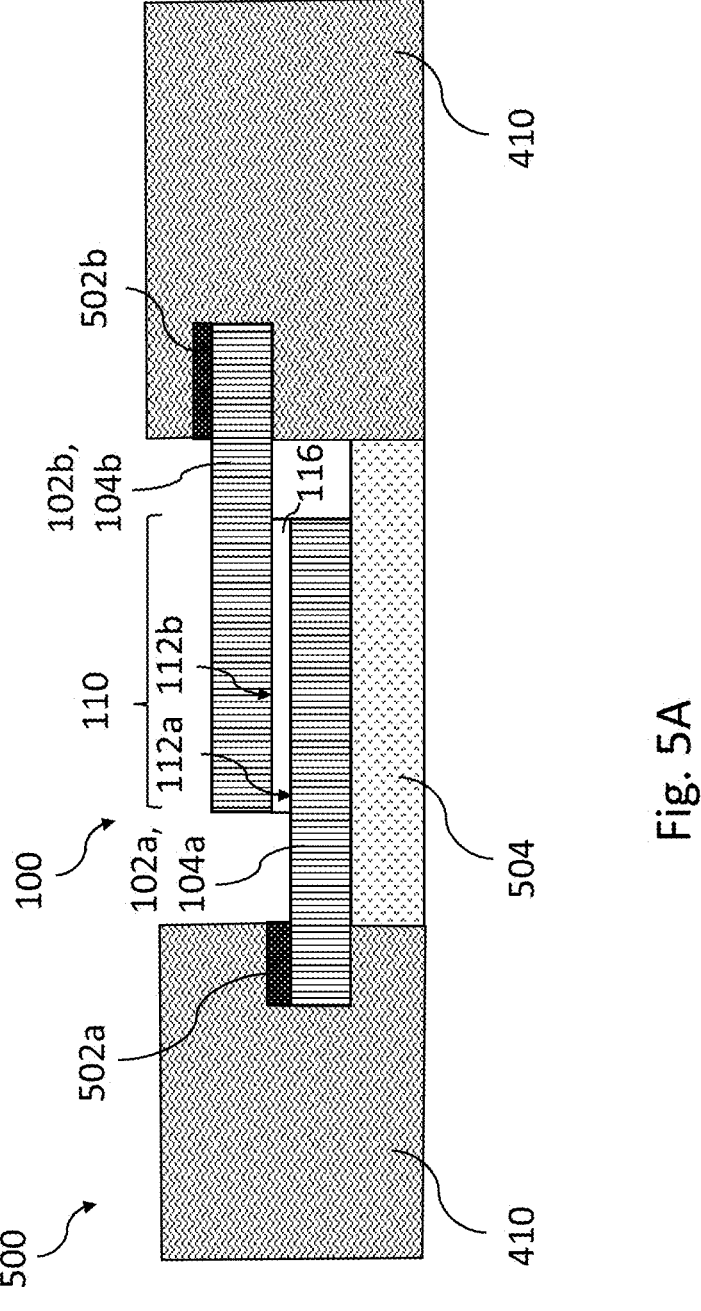
FIG. 5A shows a cross-section of a portion of the component of the high-temperature superconducting qubit of FIG. 4A.
Figure 5B:
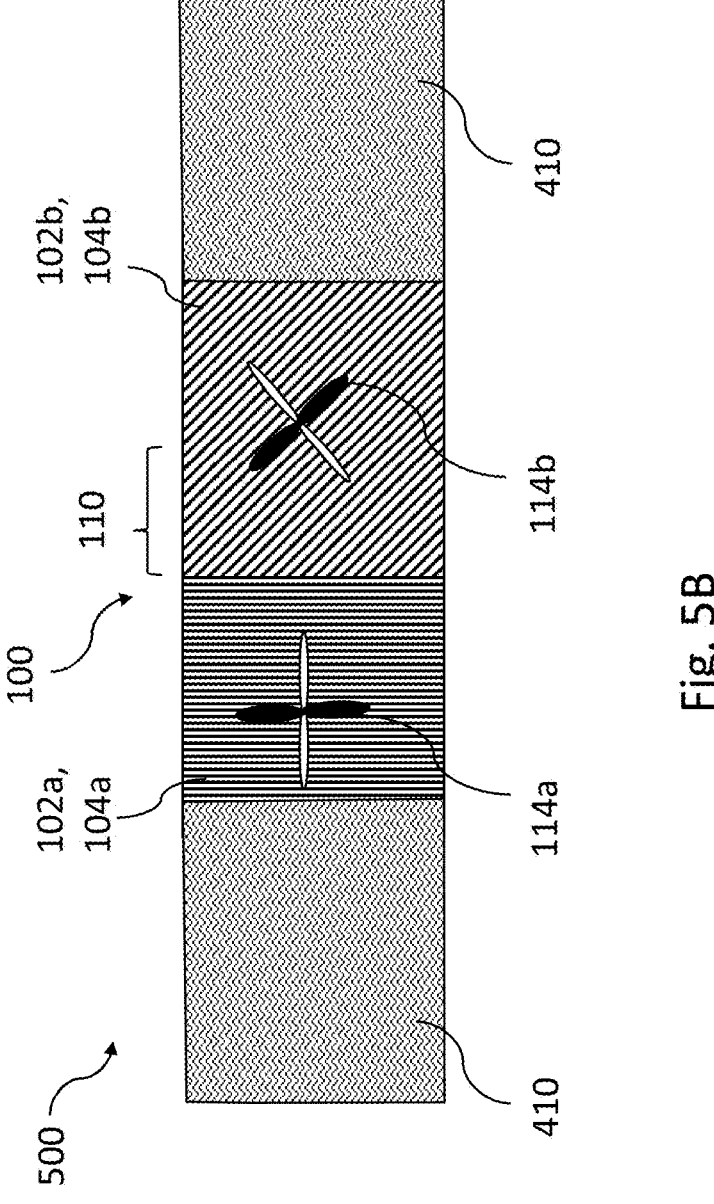
FIG. 5B shows a top view of the portion of the component of the high-temperature superconducting qubit of FIG. 4A and FIG. 5A.

FIG. 5A shows a cross section of a section 500 of the component of the qubit system of FIG. 4A. A top view of the component of the qubit system is given in FIG. 5B. Contact elements 502a, 502b are arranged on the Josephson junction 100. The contact elements 502a, 502b may be formed by depositing a conductive material, for example gold, onto the component of the qubit system after the positioning of the Josephson junction 100. Material of the circular or elliptical ring 410 with the gap, which may comprise aluminum or niobium according to some embodiments, may optionally be deposited on top of the contact elements 502a, 502b to further improve the electrical contact between the contact elements 502a, 502b and the circular or elliptical ring 410 with the gap. Moreover, a planarization layer 504 may be positioned on a substrate of the inductance loop 400 prior to the positioning of the Josephson junction 100 to improve a planarity of the component of the qubit system and in particular of the overlap region 110 to improve a parallelism of the first surface 106a and the second surface 106b, or to reduce a variation of the distance d, respectively.

Figure 6A:
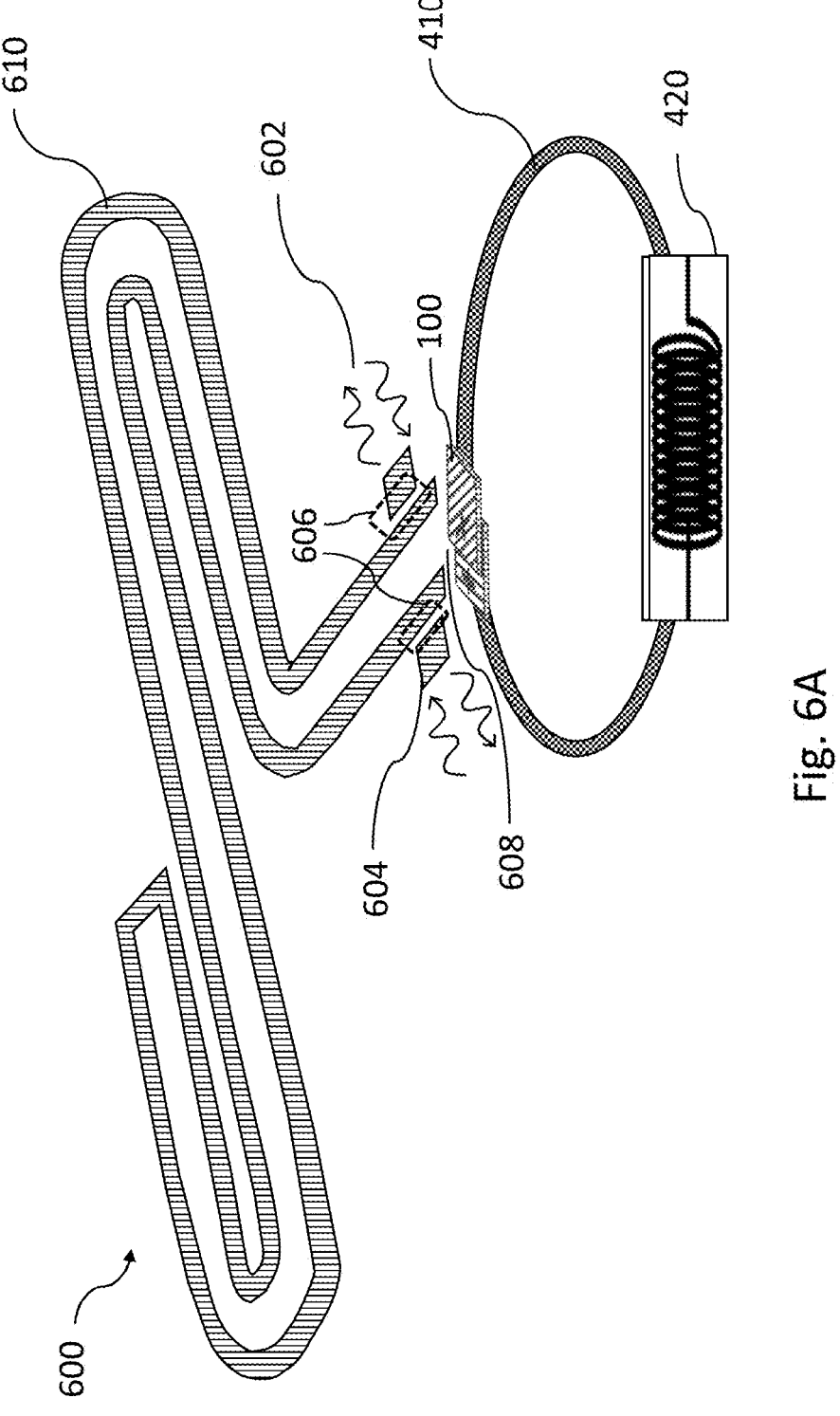
FIG. 6A shows a high-temperature superconducting qubit according to an embodiment.
Figure 6B:
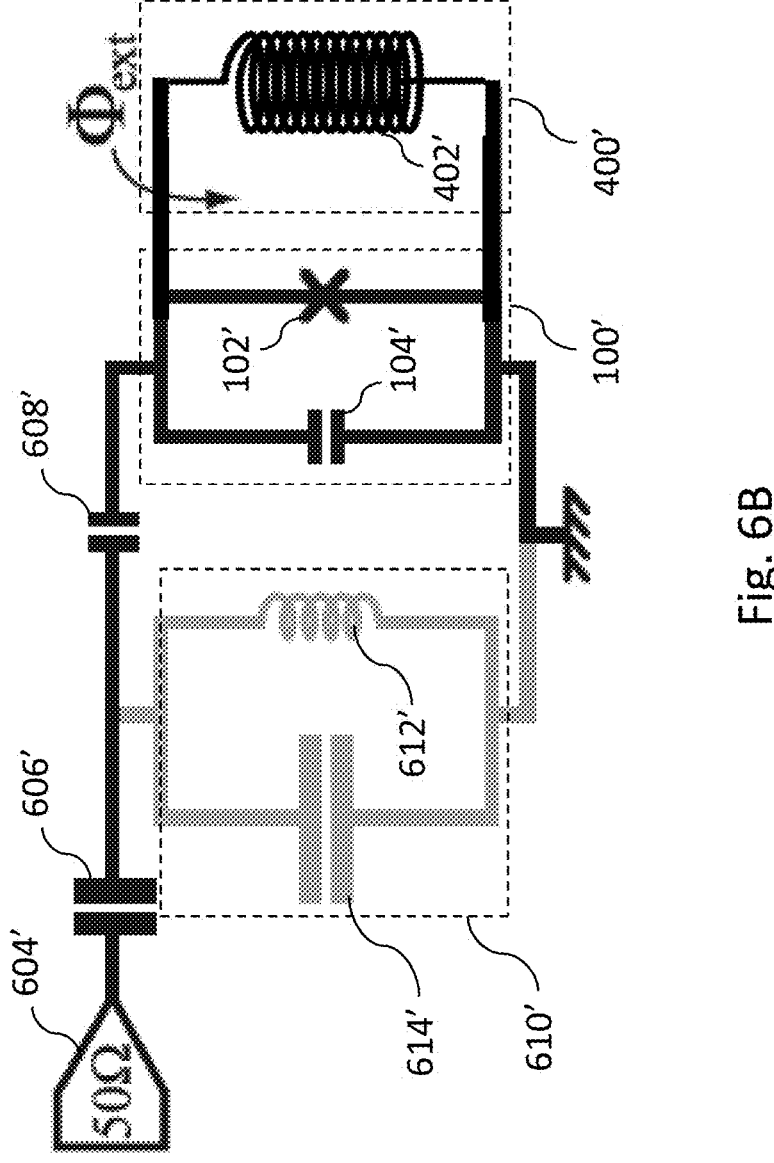
FIG. 6B shows a circuit diagram corresponding to the high-temperature superconducting qubit of FIG. 6A.

FIG. 6A shows a qubit system 600 comprising the Josephson junction 100. FIG. 6B gives a corresponding circuit diagram. In addition to the component of the qubit system of FIG. 5A, the qubit system 600 comprises a microwave resonator 610 coupled to the Josephson junction 100. The microwave resonator 610 may comprise high-temperature superconductor material or low temperature superconductor material. In particular, the microwave resonator 610 may be composed of the same material as the circular or elliptical ring 410 with the gap and/or the inductance loop 400. The microwave resonator 610 may be a quarter-wave microwave resonator. The microwave resonator 610 is adapted to act as an antenna for microwave radiation and/or has a resonance frequency in a microwave frequency range. It typically comprises two conductive wires parallel to each other. The microwave resonator 610 is coupled capacitively to the component of the qubit system through a space 608. In addition, at least one resistor 604 is capacitively coupled to the microwave resonator 610 via spaces 606 for generating a readout signal 602. In the circuit diagram of FIG. 6B, which corresponds to the qubit system 600, similar reference signs to the ones of FIG. 5A and FIG. 6A are used to indicate corresponding elements. An inductance 402' of the inductance loop 400 represents a total inductance, which may correspond to the total inductance of the circular or elliptical ring 410' with the gap and the additional inductances 420' of FIG. 4B. In addition to the elements of the circuit diagram 430 of FIG. 4B corresponding to the component of the qubit system of FIG. 4A, the circuit diagram of FIG. 6B comprises element 610' corresponding to the microwave resonator, element 608' corresponding to the capacitor mediating the coupling between the microwave resonator 610 and the component of the qubit system, element 604' representing the at least one resistor 604, and capacitance 606' mediating the coupling between the microwave resonator 610 and the at least one resistor 604.

In FIG. 6B, $\Phi_{ext}$ represents a magnetic field through the inductance loop 400. In conventional qubit systems, in particular with Josephson junctions based on low-temperature superconductors, a magnetic field through an inductance loop is typically applied according to a mode of operation. In contrast, the qubit system 600 with the Josephson junction 100 according to the description implements a fluxonium qubit, namely a $\pi$ fluxonium qubit, which may operate at a magnetic field $\Phi_{ext}$ through the inductance loop 400 of essentially zero. Therefore, additional equipment related to a generation and/or control of the magnetic field is not required. Moreover, the qubit system 600 according to the description may have a reduced sensitivity to variations and/or fluctuations in the magnetic field $\Phi_{ext}$, which may affect the operation of conventional qubit systems, in particular such conventional qubit systems in which a magnetic field is applied according to a mode of operation.

The description of the embodiments and the figures merely serve to illustrate the techniques and advantages of the present disclosure, but should not be construed to imply any limitation. The scope of the disclosure is to be determined from the appended claims.

The invention claimed is:

1. A high-temperature superconducting qubit, comprising:
a first superconductor comprising:
a first high-temperature superconductor material comprising a first layered structure, a first surface, a first primary lattice vector parallel to a layer of the first layered structure, and a first orientation associated with the first primary lattice vector,
a second superconductor comprising:
a second high-temperature superconductor material comprising a second layered structure, a second surface, a second primary lattice vector parallel to a layer of the second layered structure, and a second orientation associated with the second primary lattice vector,
an overlap region, wherein in the overlap region at least a first section of the first surface and at least a second section of the second surface overlap, the first section and the second section are arranged in parallel at a distance corresponding to a predefined distance, and the first orientation and the second orientation are arranged with an angle corresponding to a predefined angle,
wherein:
the layer of the first layered structure is essentially parallel to the first section of the first surface,
the layer of the second layered structure is essentially parallel to the second section of the second surface, and
the high-temperature superconducting qubit comprises a Josephson junction between the first high-temperature superconductor material and the second high-temperature superconductor material, wherein the Josephson junction is adapted to provide a quantum mechanical two-level system of the high-temperature superconducting qubit.

2. The high-temperature superconducting qubit according to claim 1, further comprising an inductance loop coupled to the Josephson junction, wherein the Josephson junction is adapted to provide the work of the high temperature superconducting qubit at low magnetic fields, in particular at zero magnetic field, and/or at low frequencies, thus lowering qubit sensitivity to ambient noise.

3. The high-temperature superconducting qubit according to claim 1, wherein the first high-temperature superconductor material and/or the second high-temperature superconductor material is a d-wave superconductor.

4. The high-temperature superconducting qubit according to claim 1, wherein the first high-temperature superconductor material at the first surface corresponds to a first bulk material corresponding to the first superconductor, in particular wherein a chemical composition of the first high-temperature superconductor material at the first surface is identical with a chemical composition of the first bulk material, and/or a crystalline structure of the first high-temperature superconductor material at the first surface is identical with a crystalline structure of the first bulk material; and/or
wherein the second high-temperature superconductor material at the second surface corresponds to a second bulk material corresponding to the second superconductor, in particular wherein a chemical composition of the second high-temperature superconductor material at the second surface is identical with a chemical composition of the second bulk material, and/or a crystalline structure of the second high-temperature superconductor material at the second surface is identical with a crystalline structure of the second bulk material.

5. The high-temperature superconducting qubit according to claim 1, wherein a critical current of the Josephson junction relative to a critical current of a first bulk material corresponding to the first superconductor or relative to a critical current of a second bulk material corresponding to the second superconductor is at least 0.05%, in particular at least 0.075%, or at least 0.1%, in particular at least 0.5%, in particular at least 1%, or at least 1.5%, or at least 2%, or at least 3%, or at least 5%, or at least 10%, or at least 40%.

6. The high-temperature superconducting qubit according to claim 1, wherein a critical temperature of the Josephson junction relative to a critical temperature of a first bulk material corresponding to the first superconductor or relative to a critical temperature of a second bulk material corresponding to the second superconductor is at least 0.5%, in particular at least 1%, or at least 5%, or at least 5%, or at least 10%.

7. The high-temperature superconducting qubit according to claim 1,
wherein a variation of the distance is at most 0.3 nm, in particular at most 0.2 nm, or at most 0.1 nm, or at most 0.05 nm; or
a roughness of the first section is at most 0.3 nm, in particular at most 0.2 nm, or at most 0.1 nm, or at most 0.05 nm; and a roughness of the second section is at most 0.3 nm, in particular at most 0.2 nm, or at most 0.1 nm, or at most 0.05 nm.

8. The high-temperature superconducting qubit according to claim 1, further comprising a spacer material between the first superconductor and the second superconductor, in particular between the first section and the second section.

9. The high-temperature superconducting qubit according to claim 1, wherein the predefined angle corresponds to an angle between a first orbital of the first high-temperature superconductor material and a second orbital of the second high-temperature superconductor material, in particular wherein the first orbital and/or the second orbital is a d-type orbital.

10. The high-temperature superconducting qubit according to claim 1,
wherein the first high-temperature superconductor material is anisotropic with a first layered structure, in particular wherein a layer of the first layered structure is essentially parallel to the first section of the first surface; and/or
wherein the second high-temperature superconductor material is anisotropic with a second layered structure, in particular wherein a layer of the second layered structure is essentially parallel to the second section of the second surface.

11. The high-temperature superconducting qubit according to claim 1, wherein the first high-temperature superconductor material is BSCCO, and/or wherein the second high-temperature superconductor material is BSCCO, and/or wherein the predefined angle is in the range from 43 to 47 degrees, in particular wherein the BSCCO has a chemical composition described by $Bi_2Sr_2Ca_1Cu_2O_{8+x}$.

12. The high-temperature superconducting qubit according to claim 2, further comprising
a microwave resonator adapted to act as an antenna for a microwave signal adapted for readout and/or control of the quantum mechanical two-level system, wherein the microwave resonator is coupled to the Josephson junction and/or to the inductance loop and adapted to couple the microwave signal to the quantum mechanical two-level system; and
at least one resistor coupled to the microwave resonator, wherein the at least one resistor is adapted to provide a readout signal and/or a control signal associated with the quantum mechanical two-level system.

\* \* \* \* \*